(12) United States Patent
Iwane et al.

(10) Patent No.: US 6,802,900 B2
(45) Date of Patent: Oct. 12, 2004

(54) LIQUID PHASE GROWTH METHODS AND LIQUID PHASE GROWTH APPARATUS

(75) Inventors: Masaaki Iwane, Nara (JP); Katsumi Nakagawa, Kyoto (JP); Tetsuro Saito, Kanagawa (JP); Tatsumi Shoji, Kanagawa (JP); Takehito Yoshino, Kyoto (JP); Shoji Nishida, Nara (JP); Noritaka Ukiyo, Nara (JP); Masaki Mizutani, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/022,545

(22) Filed: Dec. 20, 2001

(65) Prior Publication Data

US 2002/0108559 A1 Aug. 15, 2002

(30) Foreign Application Priority Data

Dec. 28, 2000 (JP) ..................................... 2000-402289

(51) Int. Cl.⁷ .............................................. C30B 19/00
(52) U.S. Cl. ....................................................... 117/54
(58) Field of Search ............................................ 117/54

(56) References Cited

U.S. PATENT DOCUMENTS

| | | | | |
|---|---|---|---|---|
| 3,756,194 A | * | 9/1973 | Lien ............................ | 118/52 |
| 4,026,240 A | * | 5/1977 | DeFevere .................... | 118/415 |
| 5,544,616 A | * | 8/1996 | Ciszek et al. ................ | 117/60 |
| 5,811,348 A |   | 9/1998 | Matsushita et al. ......... | 438/455 |
| 5,846,319 A | * | 12/1998 | Barton ......................... | 117/60 |
| 5,871,580 A | * | 2/1999 | Asahi et al. ................. | 117/83 |
| 6,110,347 A |   | 8/2000 | Arao et al. .................. | 205/333 |
| 6,190,937 B1 |   | 2/2001 | Nakagawa et al. .......... | 438/67 |
| 6,231,667 B1 | * | 5/2001 | Iwane et al. ................. | 117/55 |
| 6,391,108 B2 | * | 5/2002 | Nishida et al. .............. | 117/77 |
| 2002/0005158 A1 | * | 1/2002 | Nishida et al. .............. | 117/2 |
| 2002/0112660 A1 | * | 8/2002 | Nishida et al. .............. | 117/54 |

FOREIGN PATENT DOCUMENTS

| | | |
|---|---|---|
| JP | 57-76821 | 5/1982 |
| JP | 5-17284 | 1/1993 |
| JP | 5-283722 | 10/1993 |
| JP | 8-213645 | 8/1996 |
| JP | 11-189498 | 7/1999 |

OTHER PUBLICATIONS

US Pat. application # (Spec.) 09/664,340.
US Pat. application # (Spec.) 09/973,633.
US Pat. application # (Spec.) 10/014,418.

* cited by examiner

*Primary Examiner*—Nadine G. Norton
*Assistant Examiner*—Matthew Anderson
(74) *Attorney, Agent, or Firm*—Fitzpatrick, Cella, Harper & Scinto

(57) ABSTRACT

Provided are a liquid phase growth method including a step of immersing a substrate in a crucible storing a solvent having a growth material dissolved therein; and a step of cooling the solvent from an interior thereof, and a liquid phase growth apparatus for use in the method, by which a temperature difference of a solution is decreased and by which a deposited film is formed in a uniform thickness.

9 Claims, 18 Drawing Sheets

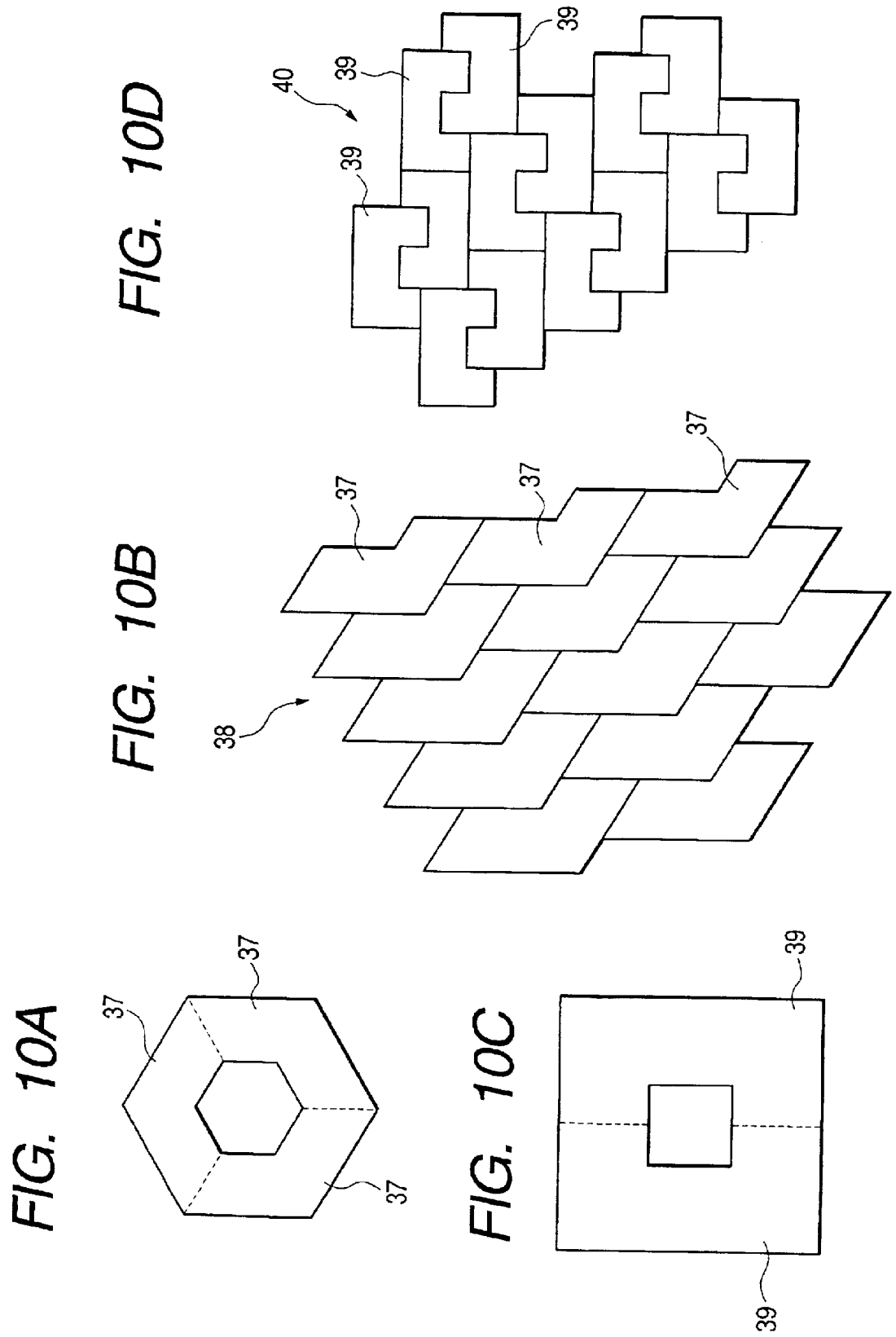

LIQUID PHASE GROWTH METHODS AND LIQUID PHASE GROWTH APPARATUS

BACKGROUND OF THE INVENTION

1. Field of the Invention

The present invention relates to liquid phase growth methods and liquid phase growth apparatus and, more particularly, is suitably applicable to liquid phase growth methods and liquid phase growth apparatus of an immersion type in which a substrate of wafer size is held by a jig and immersed into a solution containing a growth material.

2. Related Background Art

Global environments are becoming worse because of emission of earth-warming gases such as carbon dioxide, nitrogen oxides, etc. from combustion of petroleum in thermal power generation, combustion of gasoline in automotive engines, and so on. In addition, there is future concern about a drain of crude oil and attention is thus being drawn toward power generation with solar cells as clean energy sources.

Since thin-film crystal silicon (Si) solar cells have a thin power-generating layer and are made using a small amount of the source material of Si, there is a perspective of cost reduction of the thin-film crystal Si solar cells. Since the power-generating layer is made of crystal Si, higher conversion efficiency and less deterioration can be expected as compared with solar cells of amorphous Si and others. Further, since the thin-film crystal Si solar cells can be bent to some extent, they can be used in a bonded state to curved surfaces of automotive bodies, household electrical appliances, roof tiles, and so on.

For substantiating the thin-film crystal Si solar cells, Japanese Patent Application Laid-Open No. 8-213645 discloses separation of thin films of monocrystalline Si, making use of epitaxial layers on a porous Si layer. FIG. 16 is a cross-sectional view showing a method of forming a thin-film Si solar cell, described in Japanese Patent Application Laid-Open No. 8-213645. In the figure, numeral 101 designates an Si wafer, 102 a porous Si layer, 103 a p$^+$ type Si layer, 104 a p$^-$ type Si layer, 105 an n$^+$ type Si layer, 106 a protective film, 109 and 111 adhesive layers, and 110 and 112 jigs. In the process of producing the solar cell of FIG. 16, the porous Si layer 102 is made by anodization over the surface of Si wafer 101. After that, the p$^+$ type Si layer 103 is epitaxially grown on the porous Si layer 102, and the p$^-$ type Si layer 104 and n$^+$ type Si layer 105 are further grown thereon. Then, the protective film 106 is formed thereon. The adhesive layers 111, 109 are then laid over the protective film 106 and over the Si wafer 101, respectively, to be bonded to the jigs 112, 110. Thereafter, pulling forces P are exerted on the respective jigs 110, 112 to separate the Si wafer 101 from the epitaxially grown Si layers (103, 104, 105) across the porous Si layer 102. Then, the solar cell is formed in the epitaxially grown Si layers (103, 104, 105), while the Si wafer 101 is again subjected to similar steps, thereby reducing the cost.

Japanese Patent Application Laid-Open No. 5-283722 discloses growth of epitaxial Si layers on the porous Si layer by the liquid phase growth method. An Sn melt is used as a solvent, and Si is preliminarily dissolved into the Sn melt to saturate therein, prior to the growth. Then, the melt is slowly cooled, and at a certain level of supersaturation a porous surface of a wafer is dipped into the Sn melt to grow an epitaxial Si layer on the porous surface.

Japanese Patent Application Laid-Open No. 5-17284 discloses an immersion type liquid phase growth apparatus of compound semiconductor and a holding jig. FIG. 17 is a cross-sectional view of this liquid phase growth apparatus. In the figure, numeral 81 designates a wafer holder, 82 a wafer, 83 a crucible, 84 a solution, 85 a quartz reactor tube, 886 a gas introducing tube, 887 a gas exhaust tube, 88 a heater, and 89 a dummy wafer. In this immersion type liquid phase growth apparatus, the wafer holder 81 holding the wafer 82 and dummy wafer 89 is moved down (in the direction A), the wafer 82 is immersed into the solution 84 in which a growth material is dissolved. The solution 84 is retained in the crucible 83 and the crucible 83 is placed in the quartz reactor tube 85 which maintains the interior in an atmospheric (or ambient) gas (reducing gas or inert gas) by means of the gas introducing tube 86 and gas exhaust tube 87. The heater 88 is provided for control of temperature of the system. The temperature of the solution 84 is lowered by decreasing the temperature of the heater 88, whereby the growth material is precipitated from the solution 84 onto the wafer 82 to grow in liquid phase. The immersion type liquid phase growth apparatus can be constructed in smaller size as the growth apparatus for liquid phase growth on wafers of the same size than the liquid phase growth apparatus of the slide boat type and the liquid injection type. The immersion type liquid phase growth apparatus is also convenient for mass production, because a lot of wafers can be set on the holder.

Japanese Patent Application Laid-Open No. 57-76821 also discloses an immersion type liquid phase growth method. FIG. 18A is a perspective view of a wafer holder disclosed in Japanese Patent Application Laid-Open No. 57-76821. Numeral 123 designates an arm, 124 an umbrella-like plate, 125 wafers, 126 a through hole, and 122 a cylindrical member. This wafer holder can be loaded with six substrates on the umbrella-like plate 124. FIG. 18B is a plan view of this wafer holder. FIG. 18C shows a crucible 128 into which the wafer holder shown in FIGS. 18A and 18B is immersed, and a solution 129 is filled in the crucible 128. A heater 130 is placed around the crucible 128 and an auxiliary heater 131 projecting upright is located in the center and in the lower part of the crucible 128. Namely, the crucible 128 is recessed toward the interior around the auxiliary heater 131 and the auxiliary heater 131 is placed inside the recess. Since this auxiliary heater 131 prevents the central part of the solution 129 from becoming lower in temperature than the peripheral part, the solution 129 is wholly kept at even growth temperature. It is disclosed that this arrangement can thus implement the uniform liquid phase growth.

In the case of the immersion type liquid phase growth apparatus disclosed in Japanese Patent Application Laid-Open No. 5-17284 described referring to FIG. 17, when the wafer size is large for liquid phase growth over a large area, a deposited film becomes thick in the peripheral part of the wafer but thin in the central part. FIG. 19 is a cross-sectional view showing the growth of the deposited film. In the figure, numeral 82 denotes a wafer and 90 an epitaxial film deposited on the wafer 82. As illustrated, for the large wafer size, the deposited film 90 becomes thin in the central part of the wafer but thick in the peripheral part. This phenomenon becomes noticeable, particularly, when the wafer size is not less than five inches. A conceivable reason for it is that the outside part of the solution 84 is close enough to the atmospheric gas to reduce the temperature of the outside part of the solution according to the cooling of the system whereas the central part of the solution 84 is far from the atmospheric gas and is thus cooled with a lag behind the temperature reduction of the outside part. Namely, a temperature change is less since a growth start in the central part of the wafer than in the peripheral part. For this reason, a deposition amount of the deposited film 90 is considered to be smaller in the central part of the wafer than in the peripheral part.

This is also the case in the liquid phase growth method disclosed in Japanese Patent Application Laid-Open No. 57-76821, and the temperature is less unlikely to be reduced in the central part of the crucible than in the peripheral part, because there is no mechanism of intentionally cooling the solution in the crucible. For this reason, a precipitation amount of the solute is less in the central part of the crucible, so that the thickness of the deposited film is also thinner on the wafer near the central part of the crucible.

When the deposited film on the wafer has dispersion of thickness as described above, there is a possibility of contact failure, for example, when electrodes are attached to the surface of the deposited film in production of solar cell. In addition, since the thickness of the deposited film has to be determined in the thin part for sufficient absorption of light, the thick part becomes over specifications and thus the material of the deposited film is wasted. Besides, where the deposited film is thick, the peripheral part of the film is too thick for photocarriers to reach the electrodes because of the too large thickness, which degrades light conversion efficiency. For this reason, when the solar cell is made on the wafer, the deposited film is preferably made as uniform as possible. In the case of semiconductor devices other than the solar cells, the dispersion of thickness of the deposited film will require different design between in the central part and in the peripheral part of the wafer, which will increase the number of steps and, in turn, increase the production cost.

SUMMARY OF THE INVENTION

An object of the present invention is to solve the above problems separately or all together. Specifically, an object of the invention is to form a deposited film having a uniform thickness entirely over the substrate by the liquid phase growth on the substrate such as the wafer or the like.

In order to solve the aforementioned problems, the inventors conducted elaborate research and accomplished the following invention as a result.

For achieving the above object, an aspect of the present invention is a liquid phase growth method comprising the steps of:

immersing a substrate in a crucible that stores a solvent having a growth material dissolved therein; and cooling the solvent from an interior thereof.

The solvent is preferably cooled from a central part thereof.

It is preferable to implement the cooling step by letting a medium flow through a tube immersed in the crucible; by letting a medium flow through a hole formed in a jig for holding the substrate; or by letting a medium flow through a hole formed in the crucible.

Another aspect of the present invention is a liquid phase growth apparatus comprising:

a crucible for storing a solvent having a growth material dissolved therein;

a wafer cassette for holding a substrate to be immersed in the solvent; and a cooling section for cooling the solvent from an interior thereof.

The cooling section is preferably a tube which is immersed in the crucible and through which a medium is made to flow, a hole which is formed inside a wafer cassette and through which a medium is made to flow, or a hole which is formed in the crucible and through which a medium is made to flow.

The foregoing medium is, for example, a gas. The gas is preferably hydrogen or nitrogen gas as an atmospheric gas.

A liquid phase growth bath for formation of a $p^-$ type Si layer may be used as the crucible and, subsequent thereto, a liquid phase growth bath for formation of an $n^+$ type Si layer may be used as the crucible.

The growth material is, for example, Si, Ge, or GaAs.

The solvent is, for example, a melt of In or Sn.

The wafer cassette is preferably rotatable about its own axis.

The wafer cassette is preferably revolvable about an axis different from its own axis.

BRIEF DESCRIPTION OF THE DRAWINGS

FIG. 10A is a plan view of a wafer in Embodiment 3, FIG. 10B is a plan view of an array of solar-battery unit cells arranged, FIG. 10C is a plan view of another wafer, and FIG. 10D is a plan view of an array of solar-battery unit cells arranged;

DETAILED DESCRIPTION OF THE PREFERRED EMBODIMENTS

Embodiments of the present invention will be described below in detail with reference to the drawings. Four embodiments will be described below, but it is noted that the present invention is not limited to the embodiments but combinations thereof are also included in the scope of the invention.

(Embodiment 1)

Figure 1A:
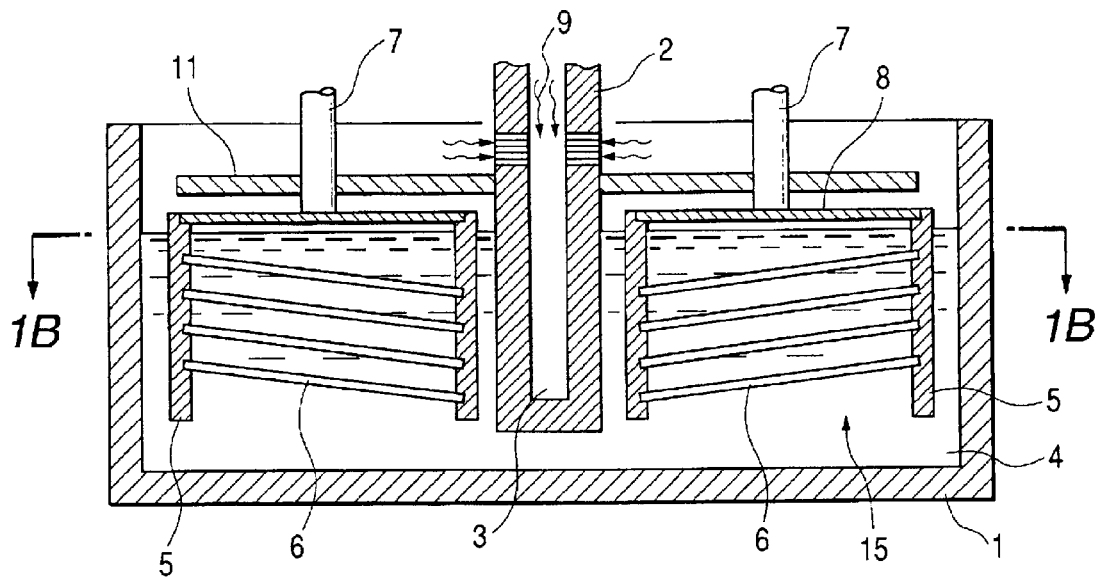
FIG. 1A is a longitudinal cross-sectional view of a wafer cassette and a crucible of a liquid phase growth apparatus of Embodiment 1 taken along line 1A—1A of FIG. 1B.
Figure 1B:
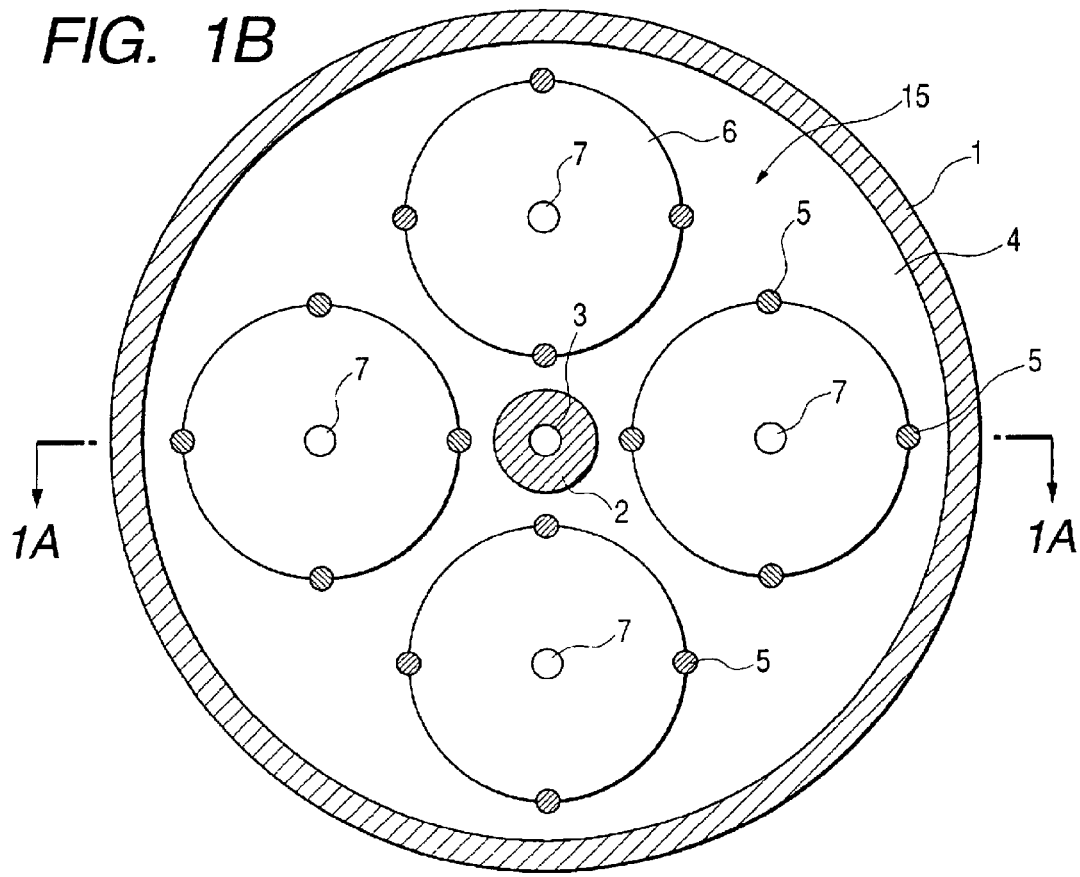
FIG. 1B is a horizontal cross-sectional view of the wafer cassette and the crucible of the liquid phase growth apparatus of Embodiment 1 taken along line 1B—1B of FIG. 1A.

In Embodiment 1, a main shaft at the center of a wafer cassette supporting Si wafers is of hollow structure. The atmospheric gas is made to flow through this hollow structure (vent hole), thereby enhancing the effect of cooling the central part of the liquid. FIGS. 1A and 1B are a longitudinal cross-sectional view and a horizontal cross-sectional view, respectively, of the wafer cassette of Embodiment 1. FIG. 1A is a cross-sectional view taken along a line 1A—1A of FIG. 1B, and FIG. 1B a cross-sectional view taken along a line 1B—1B of FIG. 1A. In the figures, numeral 1 designates a crucible, 2 a main shaft, 3 a vent hole, 4 a solution stored in the crucible 1, 5 wafer support pins, 6 Si wafers, 7 shafts of rotation, 8 support-pin-fixing disks, and 11 a rotation-shaft-supporting disk. The crucible 1, main shaft 2, wafer support pins 5, rotation shafts 7, support-pin-fixing disks 8, and rotation-shaft-supporting disk 11 are preferably made of quartz so as to resist temperatures of approximately 1000° C.

Figure 2:
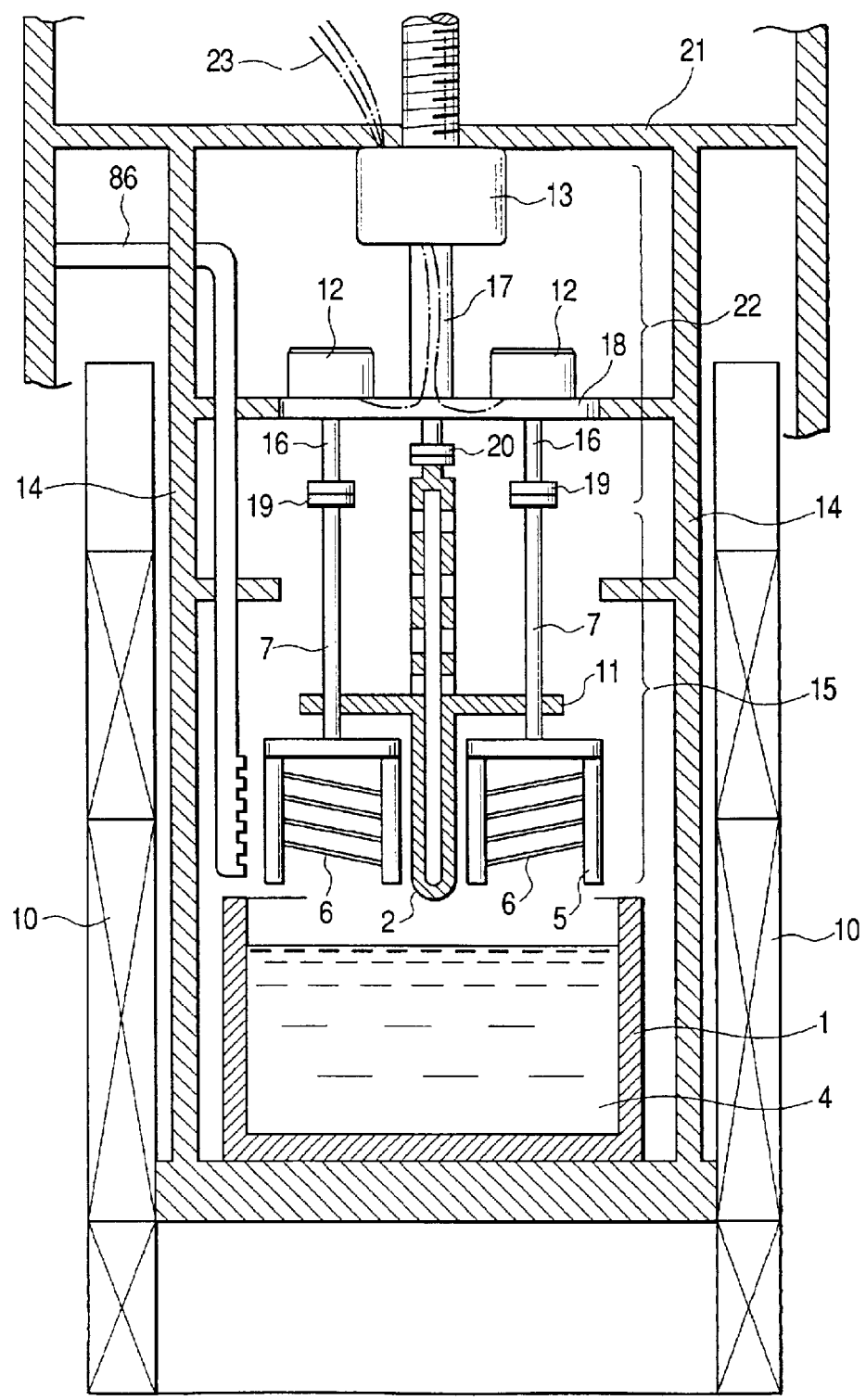
FIG. 2 is a longitudinal cross-sectional view of the liquid phase growth apparatus of Embodiment 1.

FIG. 2 is a longitudinal cross-sectional view of the liquid phase growth apparatus including a heater 10, a driving system 22, and the wafer cassette 15 of FIGS. 1A and 1B. The crucible 1 and wafer cassette 15 are set in the quartz reactor tube 14. The heater 10 is set outside the quartz reactor 14 and is composed of three parts top, middle, and bottom. The central part is placed around the crucible 1 to heat the crucible 1. The heater also covers a range approximately equal to the height of the crucible 1 above the crucible 1. This is for cleaning surfaces of the Si wafers 6 by hydrogen annealing at the temperature of about 1040° C. before the wafer cassette 15 is immersed into the crucible 1.

The driving system 22 will be described below. In FIG. 2, numeral 13 denotes a motor for the shaft of revolution, 12 motors for the rotation shafts, 16 rotation-shaft supports, 17 a main-shaft support, 18 an upper rotation-shaft-supporting disk, 19 and 20 couplings, 21 a wafer cassette support system, and 23 lead wires for supplying power to the revolution-shaft motor 13 and to the rotation-shaft motors 12. The rotation-shaft supports 16, main-shaft support 17, upper rotation-shaft-supporting disk 18, and entire support are made of stainless steel. The main-shaft support 17 is coupled to the quartz main shaft 2 at the coupling 20 with bolts and nuts or the like. The rotation shafts 7 are also coupled similarly to the rotation-shaft supports 16 at the couplings 19. Numeral 86 is a gas introducing tube for introducing the atmospheric gas of hydrogen, nitrogen, or the like into the quartz reactor 14.

The wafer cassette support system 21 is continuous from the outer frame and supports the driving system 22, the wafer cassette 15, and so on. The revolution-shaft motor 13 rotates the main shaft 2 serving as an axis of revolution of the wafer cassette 15 through the main shaft support 17. The lead wires are routed through the main shaft support 17, so that the power is supplied to the rotation-shaft motors 12 through the wires. Ring electrodes are placed in the revolution-shaft motor 13 so that electrical conduction is maintained between the lead wires 23 and the lead wires in the main shaft support even during revolution of the main shaft support 17.

Figure 6:
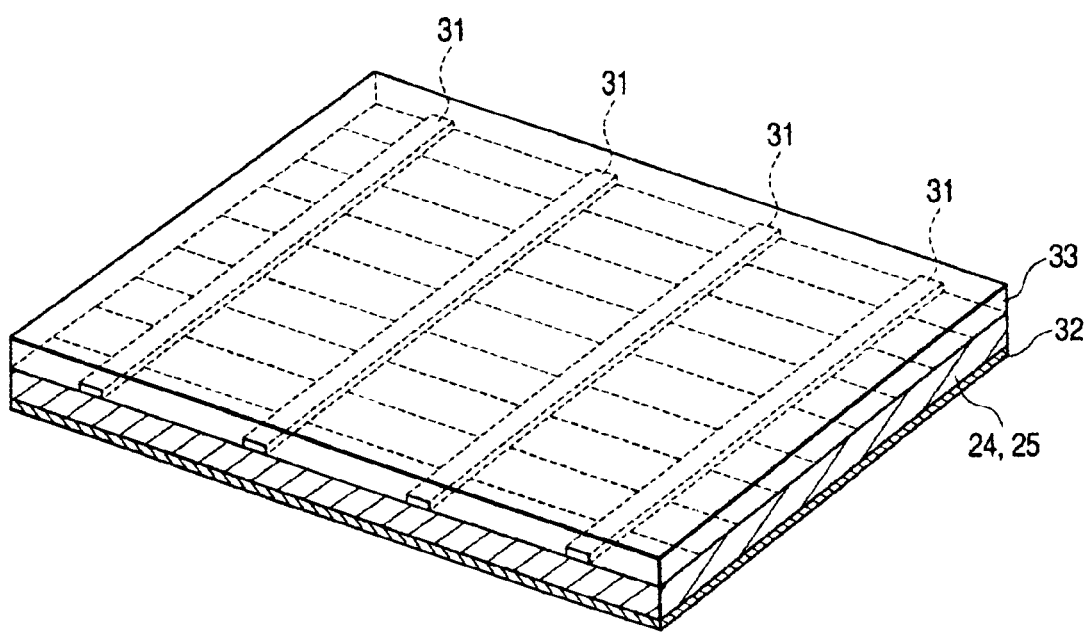
FIG. 6 is a perspective view of a solar-battery unit cell.

The following will describe an example of production of a peeling type solar cell, using the liquid phase growth apparatus of Embodiment 1. FIGS. 3A to 3E and FIGS. 4A to 4D are cross-sectional views showing production steps of the solar cell of this structure, and FIG. 6 is a perspective view of the complete solar cell.

Figure 3A:
FIGS. 3A, 3B, 3C, 3D, and 3E are a flowchart consisting of cross-sectional views showing production steps of a solar cell.
Figure 3B:

First, the monocrystalline Si wafer 6 is prepared as shown in FIG. 3A. Then, a porous Si layer 27 is formed in the thickness (1 to 30 $\mu$m) on the surface of the Si wafer 6 by anodization, as shown in FIG. 3B. The thickness of the Si wafer 6 is about 600 $\mu$m and the porous Si layer 27 about 1 to 30 $\mu$m. Therefore, only an extreme surface region of the Si wafer 6 is changed into the porous Si layer 27. The major part of the Si wafer 6 remains as non-porous Si layer 28.

Figure 5A:
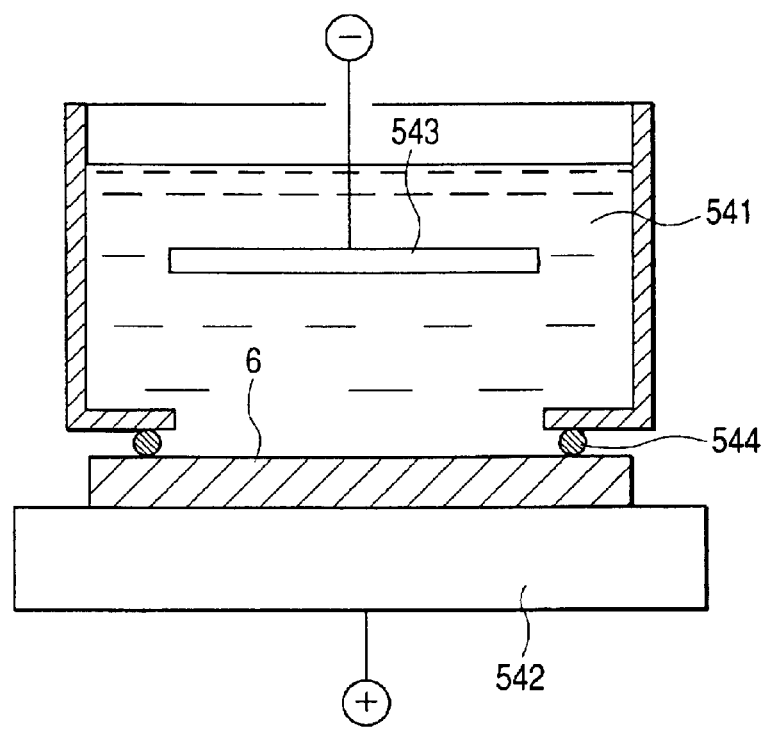
FIGS. 5A and 5B are longitudinal cross-sectional views of respective anodization systems.
Figure 5B:
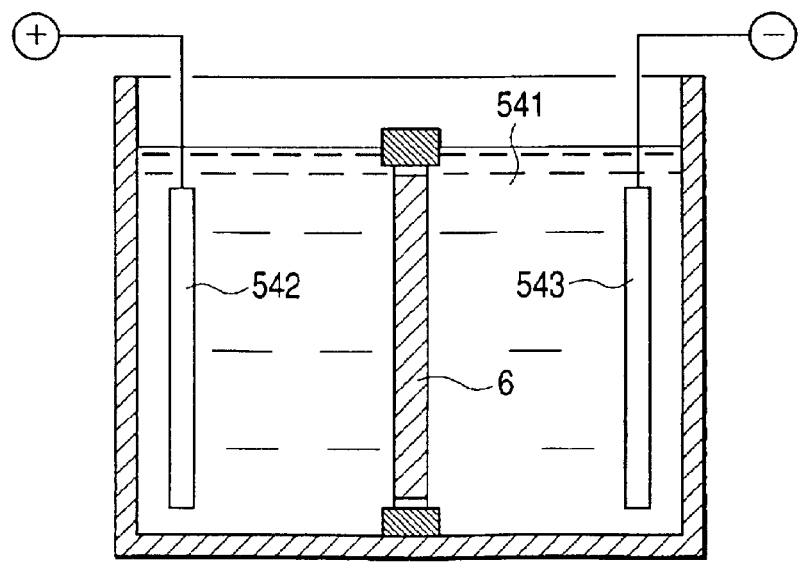

FIGS. 5A and 5B are cross-sectional views of respective systems for treating (or anodizing) the Si wafer 6 with a hydrofluoric acid base etchant. In the figures, numeral 6 denotes the Si wafer, 541 the hydrofluoric acid base etchant, 542 and 543 metal electrodes, and 544 an O-ring. The Si wafer 6 to be treated is desirably of the p-type, but may be of the n-type if the resistance is low. It is also possible to make even the n-type wafer porous if it is in a hole-generated state under irradiation with light. When the system is arranged so that a voltage is placed between the two electrodes with the lower metal electrode 542 being positive and the upper metal electrode 543 being negative and so that an electric field caused by this voltage is applied normally to the surface of the Si wafer 6 as shown in FIG. 5A, the upper surface of the Si wafer 6 is made porous. When the system is arranged so that the Si wafer 6 is placed between the two electrodes and so that the voltage is applied with the left metal electrode 542 being positive and the right metal electrode 543 being negative as shown in FIG. 5B, the right surface or negative-electrode-side surface of the Si wafer 6 is made porous. The hydrofluoric acid base etchant 541 is, for example, concentrated hydrofluoric acid (e.g., 49% HF). The metal electrodes 542, 543 are, for example, Pt, Au, or the like. During the anodization bubbles evolve from the Si wafer 6. In order to eliminate the bubbles efficiently, alcohol is sometimes added as a surfactant. The alcohol is desirably either of methanol, ethanol, propanol, isopropanol, and so on. An agitator may also be used instead of the surfactant so as to perform the anodization while agitating the solution. The thickness of the surface to be made porous is desirably 0.1 to 30 $\mu$m and more desirably 1 to 10 $\mu$m.

In the anodization step, in order to facilitate the later work in the separation step, the electric current from the metal electrode 542 to the metal electrode 543 is altered during the anodization. For example, a small electric current is allowed to flow in the first half of anodization to make the extreme surface layer of the Si wafer 6 porous, and a large electric current is allowed to flow in the second half of anodization to make porous the region near the interface between the non-porous Si layer 28 and the porous Si layer 27. In this case, the surface layer in the porous Si layer 27 is made in structure of small pores facilitating the later epitaxial growth, while the layer on the non-porous Si layer 28 side of the porous Si layer 27 is made in structure of large pores facilitating the separation. This structure results in facilitating execution of the later epitaxial growth step and the separation step. It is a matter of course that the anodization may also be carried out at a fixed electric current, for simplicity of steps.

Figure 3C:
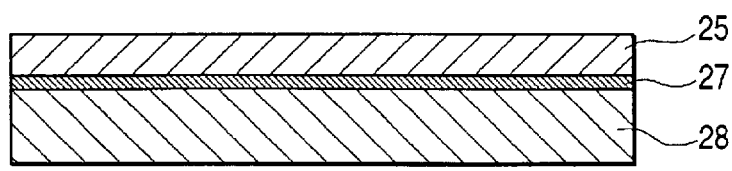

Next, as shown in FIG. 3C, a p⁻ type Si layer 25 of an epitaxial layer (single crystal) is grown on the porous Si layer 27 by liquid phase growth. The thickness of this layer is 20 to 50 μm. In the case of Embodiment 1, this epitaxial layer is the deposited film of the present invention. This step is carried out by the liquid phase growth apparatus and method of the present invention described referring to FIGS. 1A and 1B and FIG. 2. The details will be described below.

First, to-be-dissolved Si wafers as washed with dilute hydrofluoric acid or the like are set on the wafer cassette 15. The wafer support pins 5 are provided with slots for Si wafers to be inserted thereinto. The Si wafers are slid into the slots to be supported thereon. The slots of the wafer support pins 5 are formed so as to support the Si wafers obliquely, in order to prevent the solution 4 from remaining on the Si wafers when the Si wafers 6 are lifted up from the solution 4.

Next, the wafer cassette 5 is attached to the driving system 22 through the couplings 19, 20, as shown in FIG. 2. At this time, it is preferable to preset the coupling 20 of the main shaft 2 in a regular coupling state and uncouple only the couplings 19 to allow insertion and extraction of the wafer cassette 15. The wafer cassette 15 is incorporated into the liquid phase growth apparatus in this way, and the wafer cassette 15 is placed immediately above the solvent, as shown in FIG. 2. Then, the heater 10 is energized and annealing is carried out at 1040° C. for about ten minutes to clean the surfaces of Si wafers 6. This annealing is carried out in a hydrogen atmosphere. At this time, it is desirable to rotate the Si wafers by means of the revolution motor 13 and rotation motors 12.

After that, the energization state of the heater 10 is adjusted to control the solvent in the crucible 1 to the temperature of about 960° C., and then the wafer cassette 15 and the driving system 22 are moved down by the vertical motion mechanism to immerse the Si wafers into the solvent. The Si wafers are kept in the immersed state for about one hour. During this period Si is dissolved from the Si wafers into the solvent. Then, the wafer cassette 15 is lifted up from the solution 4 and the wafer cassette 15 is taken out of the liquid phase growth apparatus to complete the dissolution of Si into the solvent. The solvent containing Si is prepared in this way.

In the next place, Si wafers 6 with the porous Si layer 27 on the surface, also cleaned with dilute hydrofluoric acid or the like, are set on another wafer cassette 15. Then, the wafers 6 are annealed in a hydrogen atmosphere as the dissolving wafers were. Thereafter, the energization state of the heater 10 is adjusted to control the temperature to 950° C. At this stage, Si goes into a supersaturated state in the solution 4 containing it. Then, the wafer cassette 15 and the driving system 22 are moved down by the vertical motion mechanism to immerse the Si wafers 6 into the solution 4. After that, the energization state of the heater 10 is adjusted to control the solution 4 gradually down to about 900° C., whereupon a film of Si is deposited from the solution 4 onto the Si wafers 6. Then, the wafer cassette 15 is lifted up from the solution 4 and is taken out of the liquid phase growth apparatus to complete the liquid phase growth.

In the liquid phase growth of Embodiment 1, it is normally desirable to rotate the Si wafers about their own axes and revolve the Si wafers about the principal axis by the rotation-shaft motors 12 and the revolution-shaft motor 13. However, even the interior of the solution 4 varies following the temperature in the atmosphere in the quartz reactor 14 through the vent hole 3. For this reason, uniformity of thickness of the epitaxial layer by the liquid phase growth can be ensured even without the rotation and revolution of the Si wafers in particular. Accordingly, it is possible to employ either of the rotation and revolution or neither of the rotation and revolution, particularly, during the growth.

Figure 3D:
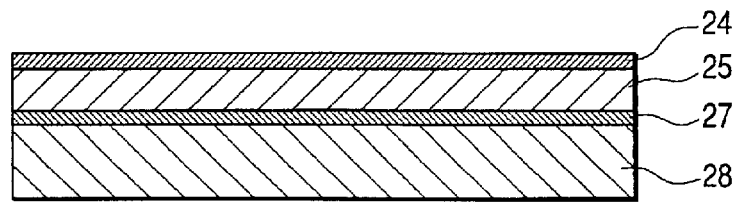
Figure 3E:
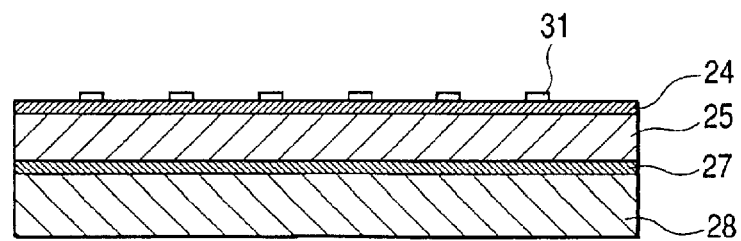
Figure 4A:
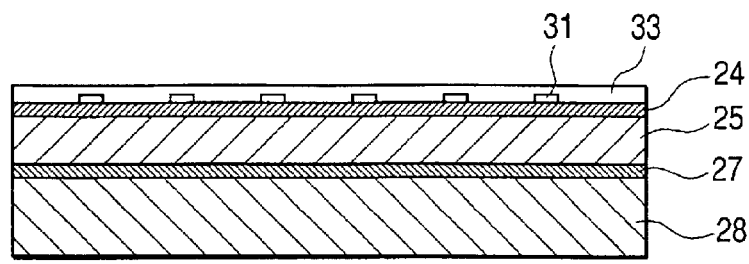
FIGS. 4A, 4B, 4C, and 4D are a flowchart consisting of cross-sectional views showing production steps of a solar cell.

After completion of the liquid phase growth of the p⁻ type Si layer 25 by the liquid phase growth method, the surface part of the p⁻ type Si layer 25 is changed into an n⁺ type Si layer 24 by diffusion of an impurity, as shown in FIG. 3D. Then, surface electrodes 31 are formed by a method of printing or the like on the n⁺ type Si layer 24, as shown in FIG. 3E. The surface electrodes 31 have the structure like comb teeth as shown in FIG. 6 of a perspective view. Then, an antireflection coating of TiO (titanium oxide), MgF (magnesium fluoride), SiN (silicon nitride), or the like is formed on those regions which are not covered by the surface electrodes 31 of the n⁺ type Si layer 24 by a method of sputtering or the like, and a glass substrate 33 is bonded thereonto with an adhesive, as shown in FIG. 4A.

Figure 4B:
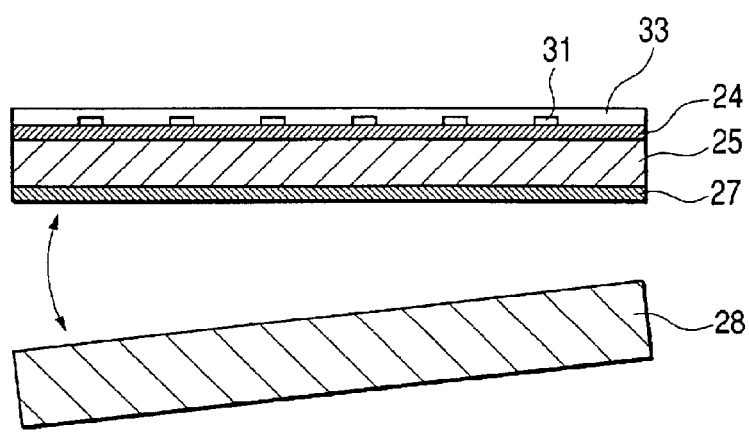
Figure 4C:
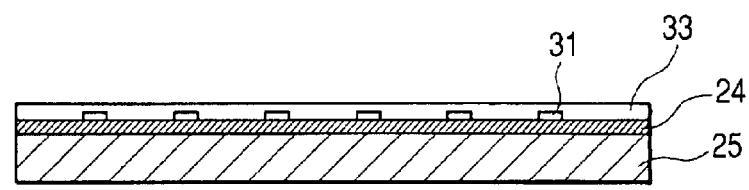
Figure 4D:
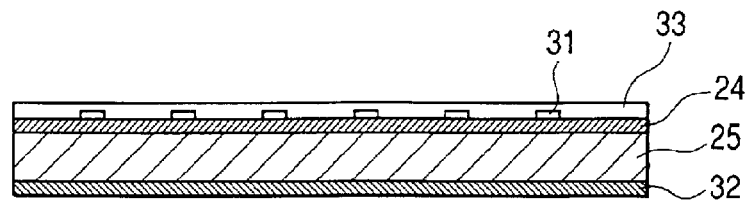

After that, pulling forces are exerted between the glass substrate 33 and the non-porous Si layer 28 to separate the part to become the solar cell, from the non-porous Si layer 28 at the part of the porous Si layer 27. The non-porous Si layer 28 thus separated is then treated with an alkali etchant to remove the residue of porous Si remaining on the surface, and it is again used as Si wafer 6 in the steps from FIG. 3A. The part to become the solar cell as separated in FIG. 4B is also treated with the alkali etchant to remove the residue of porous Si layer 27 and obtain the residueless structure as shown in FIG. 4C. After that, as shown in FIG. 4D, a back electrode 32 of stainless steel or Al sheet or the like is bonded to the back surface of the p⁻ type Si layer 25 with an electroconductive adhesive, thereby completing the unit cell for a solar cell of FIG. 6. The bonding of the back electrode 32 to the p⁻ type Si layer 25 may also be implemented by thermal bonding.

When the liquid phase growth of the immersion type is carried out using the liquid phase growth apparatus of Embodiment 1, the central part of the solution can also be cooled in accordance with the temperature control of the heater, whereby the deposited film can be grown with less thickness dispersion. Further, a lot of Si wafers can be set on the wafer cassette, which is suitable for mass production. Embodiment 1 was described above as the example in which the porous Si layer was formed on the Si wafer and in which the monocrystalline Si layer was epitaxially grown thereon, but it is noted that the Si wafer may be replaced by a Ge or GaAs wafer and that Ge, GaAs, or the like may be grown on the porous Si layer obtained by anodization of the Si wafer. The embodiment was the example of production of the solar cell, but the present embodiment may also be applied to production of an epitaxial wafer, an SOI (Silicon on Insulator) substrate, and so on.

(Embodiment 2)

Figure 7A:
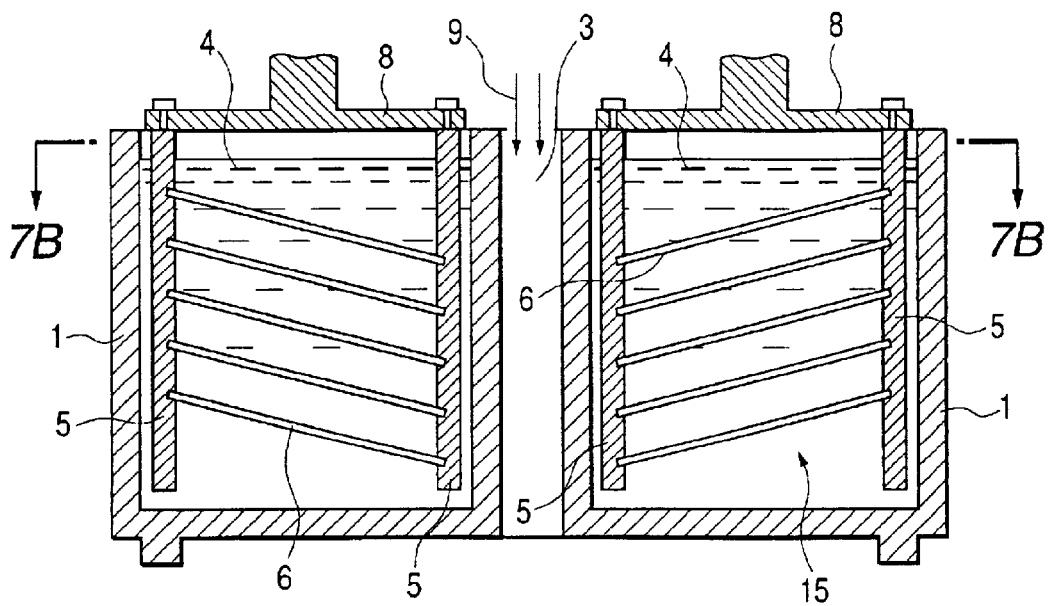
FIG. 7A is a longitudinal cross-sectional view of wafer cassettes and a crucible in Embodiment 2 taken along line 7A—7A of FIG. 7B.
Figure 7B:
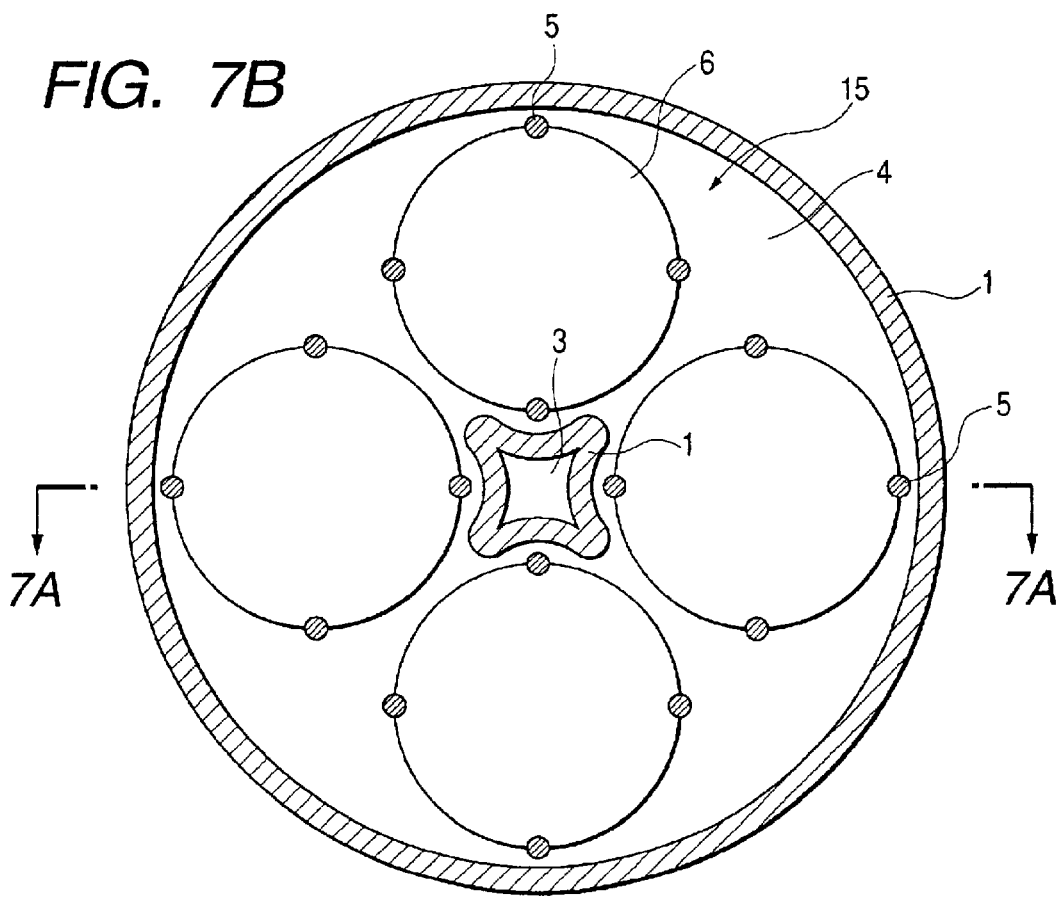
FIG. 7B is a horizontal cross-sectional view of the wafer cassettes and the crucible in Embodiment 2 taken along line 7B—7B of FIG. 7A.
Figure 8:
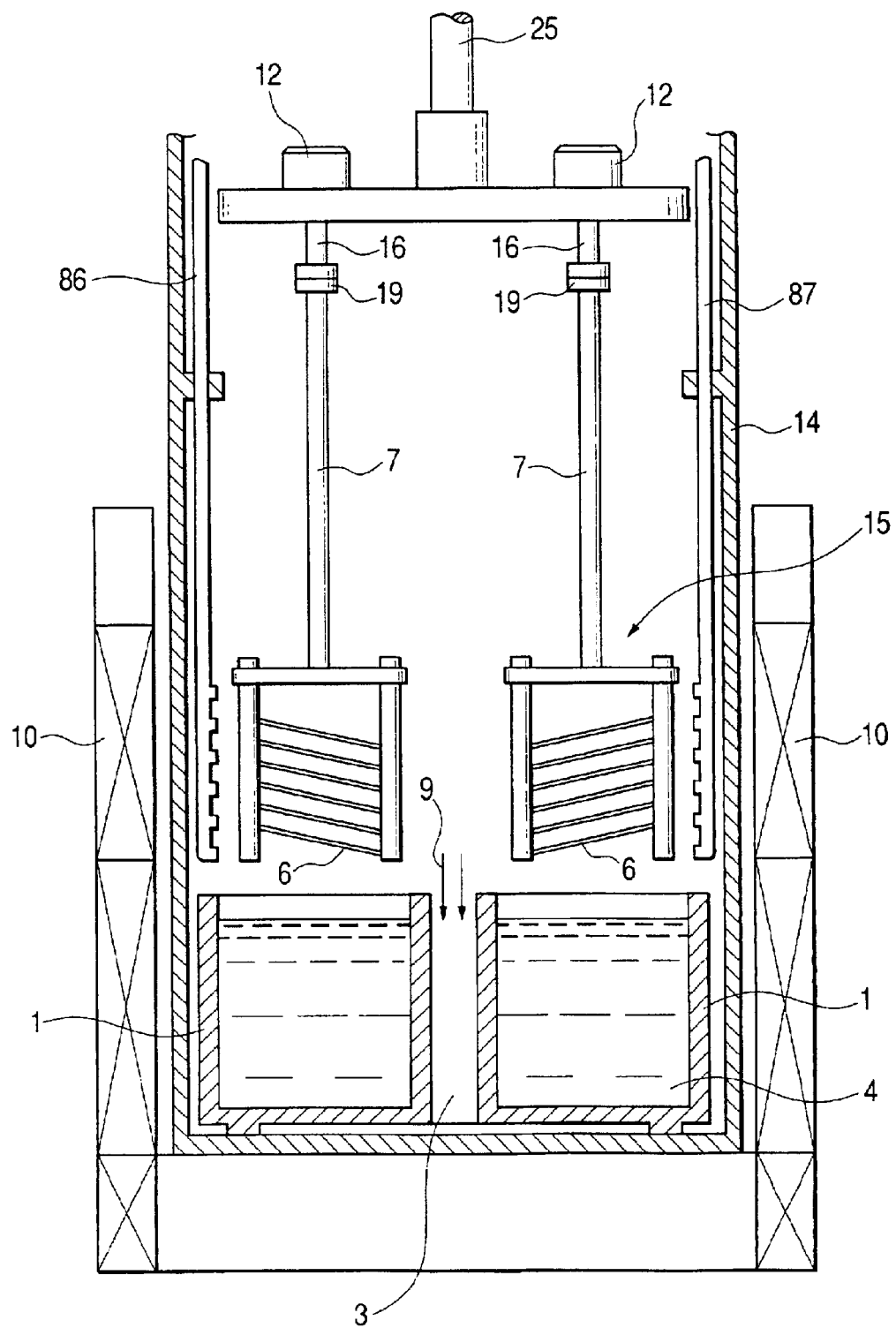
FIG. 8 is a longitudinal cross-sectional view of the liquid phase growth apparatus of Embodiment 2.

In Embodiment 2, the central part of the crucible is of hollow structure. The atmospheric gas is made to flow through this hollow structure (vent hole), which enhances the cooling effect of the central part of the solution. In Embodiment 2, four wafer cassettes 15 are immersed into one crucible. FIGS. 7A and 7B are a longitudinal cross-sectional view and a horizontal cross-sectional view, respectively, of the wafer cassettes and the crucible in Embodiment 2. The reference numerals of the components are the same as those in the foregoing figures. FIG. 8 is a cross-sectional view of the apparatus in a state in which the wafer cassettes are lifted from the crucible 1. Numeral 86 designates a gas introducing tube, and 87 a gas exhaust tube. In this liquid phase growth apparatus, each wafer cassette is rotated only about its own axis by the rotation-shaft motor 12, and the revolution mechanism as in Embodiment 1 is not provided, which simplifies the structure. As shown in FIGS. 7A and 7B and FIG. 8, the crucible 1 of Embodiment 2 is provided with the vent hole 3 in the central part to allow the flow of the atmospheric gas 9, so that the central part of the solution 4 can also be cooled as the peripheral part can. The shapes of the gas introducing tube and gas exhaust tube are properly modified in order to secure the flow of the atmospheric gas 9.

(Embodiment 3)

Figure 9A:
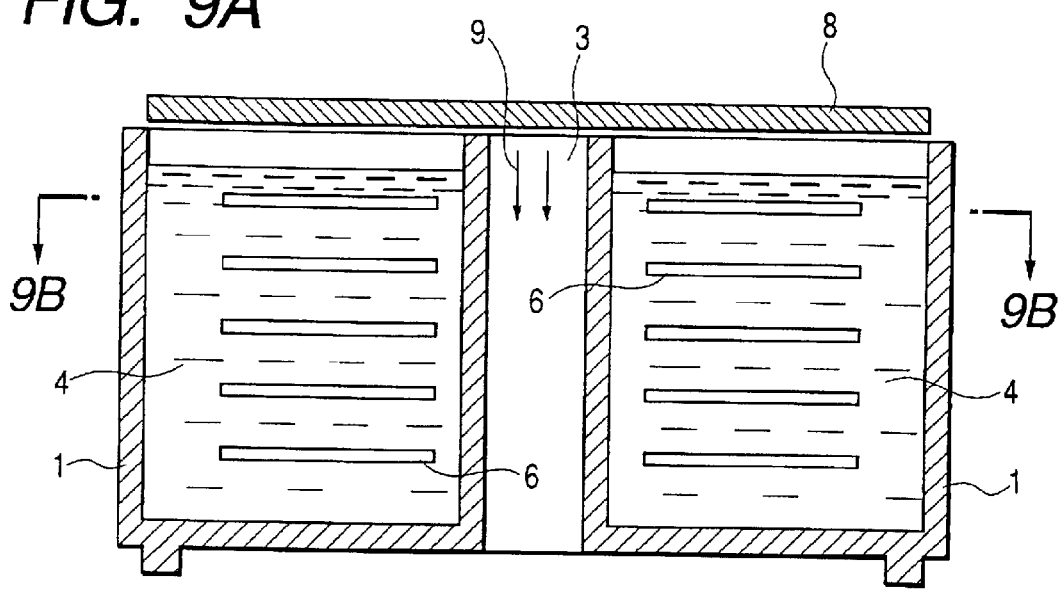
FIG. 9A is a longitudinal cross-sectional view of a wafer cassette and a crucible in Embodiment 3 taken along line 9A—9A of FIG. 9B.
Figure 9B:
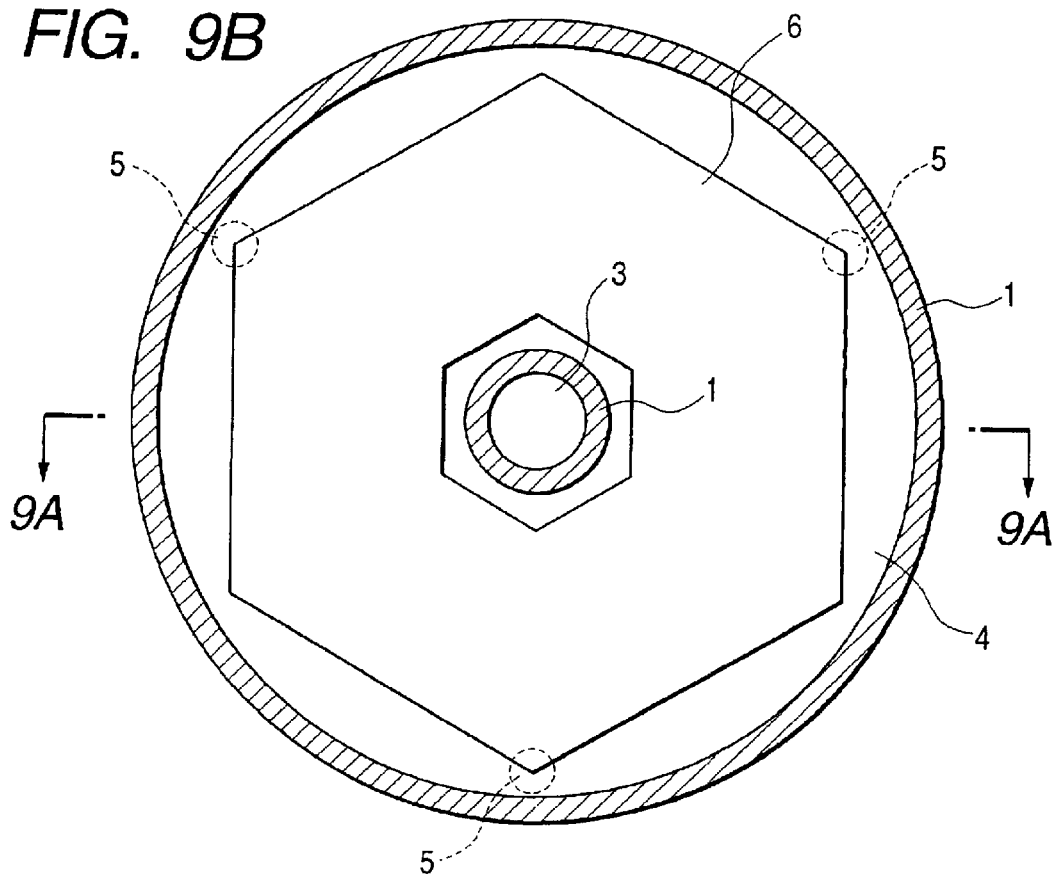
FIG. 9B is a horizontal cross-sectional view of the wafer cassette and the crucible in Embodiment 3 taken along line 9B—9B of FIG. 9A.

In Embodiment 3, the central part of the crucible storing the solution is also of hollow structure, as in Embodiment 2. The atmospheric gas is also made to flow through the hollow structure (vent hole), which enhances the cooling effect of the central part of the solution. However, there is only one wafer cassette provided, and each Si wafer has a hole in the central part. FIGS. 9A and 9B are a longitudinal cross-sectional view and a horizontal cross-sectional view, respectively, of the wafer cassette and crucible in Embodiment 3. Reference numerals of the components are the same as those in the foregoing figures. The sectional view of FIG. 9A is a cross section taken along a line 9A—9A in the sectional view of FIG. 9B. The sectional view of FIG. 9B is a cross section taken along a line 9B—9B in the sectional view of FIG. 9A. In Embodiment 3 each Si wafer 6 is hexagonal and a hexagonal hole is bored in the central part thereof. While the Si wafers 6 are immersed into the crucible 6 filled with the solution 4, the vent hole 3 of the crucible 1 passes through the holes in the center of the Si wafers. The hexagonal Si wafers are Si wafers with the surface of (111) plane, and it is desirable to form the wafers into the hexagonal shape by making use of their cleavage.

In the liquid phase growth of Embodiment 3, since the atmospheric gas can be fed to near the solution in the central part of the Si wafers, the temperature of the solution 4 is uniformly lowered in the central part and in the peripheral part of each Si wafer, whereby a film can be liquid-phase-grown in uniform thickness across the entire wafer. Each Si wafer 6 is supported by three wafer support pins 5 connected to the support pin fixing disk 8 and is rotated thereby, which permits the liquid phase growth to be done with better uniformity. When the liquid phase growth of Embodiment 3 is applied to the production steps of solar cell described in Embodiment 1, approximately hundred thin-film monocrystalline solar-battery unit cells are obtained from a single Si wafer.

A thin film of single crystal grown and peeled in Embodiment 3 is cut along dotted lines of FIG. 10A to obtain solar-battery unit cells 37. Complete solar-battery unit cells 37 are arranged as shown in FIG. 10B to obtain a solar cell module 38 at a high fill factor. In Embodiment 3, it is also possible to use Si wafers with a square circumference and with a square hole in the center, as shown in FIG. 10C, and to carry out the liquid phase growth and the cell formation of solar cells according to similar methods, thereby forming unit cells 39. In this case, the unit cells 39 are arranged as shown in FIG. 10D to obtain a solar cell module 40 at a high fill factor. The modules of FIGS. 10B and 10D have the shapes like geometrical patterns, which add the effect of enhancing diversity of design, for example, where the solar cells are mounted on roofs of houses.

(Embodiment 4)

Figure 11:
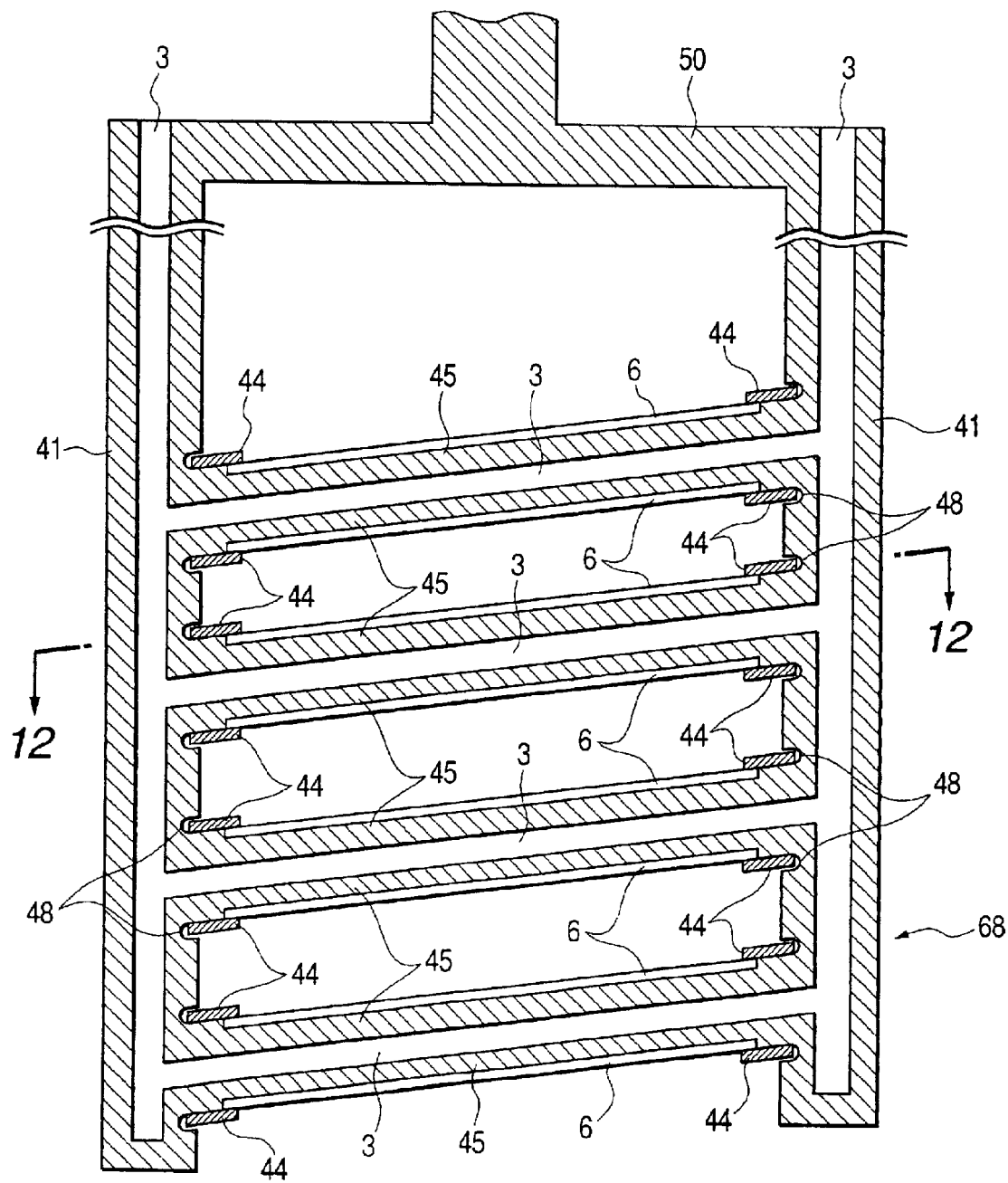
FIG. 11 is a longitudinal cross-sectional view of a wafer cassette in Embodiment 4.
Figure 12:
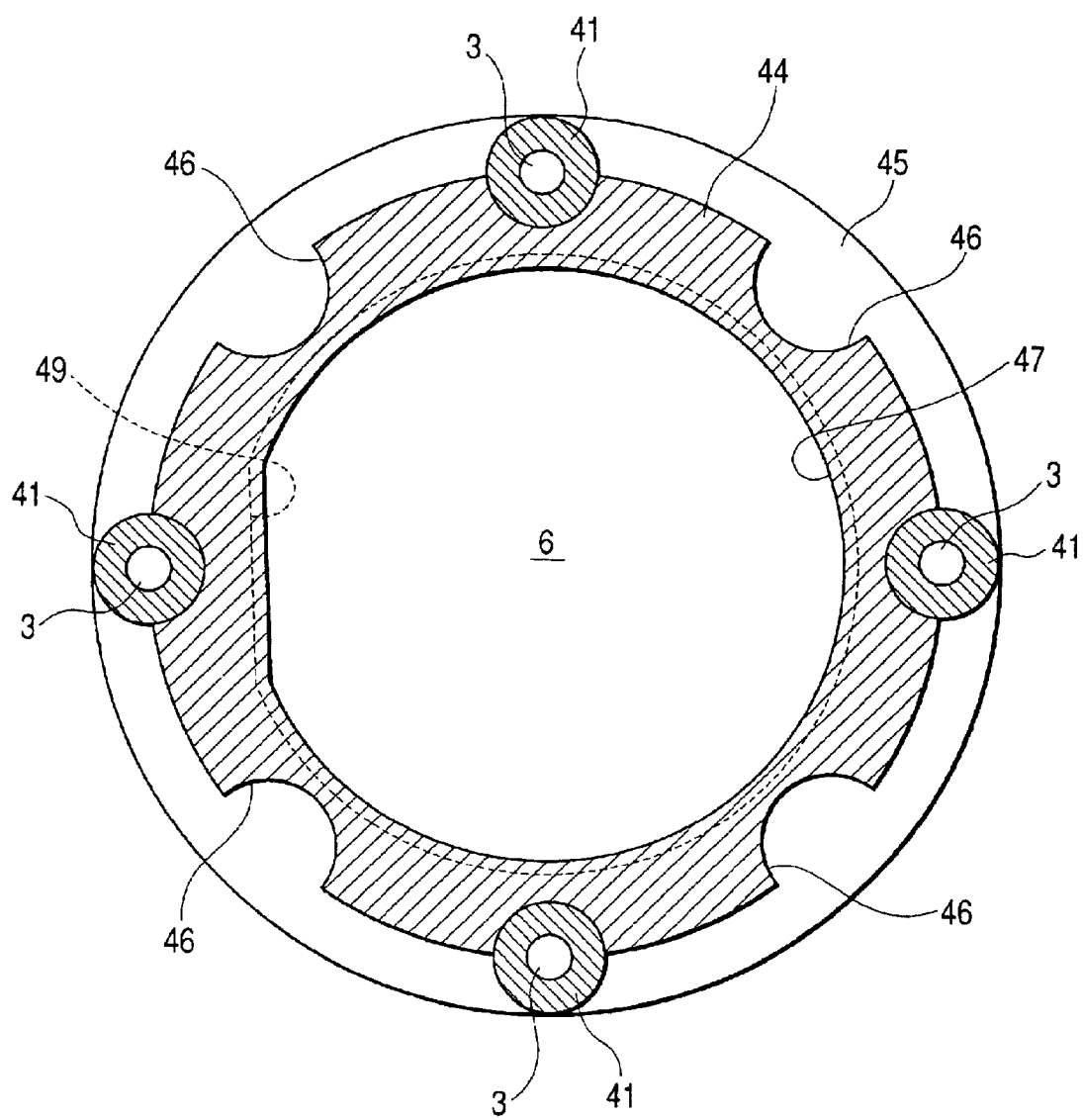
FIG. 12 is an oblique cross-sectional view of the wafer cassette in Embodiment 4 taken along line 12—12 of FIG. 11.

In Embodiment 4, the wafer cassette is provided with a vent hole. FIG. 11 and FIG. 12 are longitudinal and oblique cross-sectional views, respectively, of the wafer cassette 68 of Embodiment 4. The sectional view of FIG. 12 is a cross section taken along a line 12—12 of FIG. 11, viewed from obliquely above. In the figures, numeral 41 designates support columns, 44 covers (wafer covers), 45 seatings (wafer backing seatings), and 50 a column-supporting disk, all of which are made of quartz so as to resist the temperature of about 1000° C. In Embodiment 4 the wafer cassette has the wafer backing seatings 45 for holding Si wafers 6 thereon, and the Si wafers 6 are held on the back and front surfaces of the wafer backing seatings 45. The columns 41 supporting each of the wafer backing seatings 45, and the wafer backing seatings 45 themselves are made of quartz in integral structure. The column-supporting disk 50 is made of quartz in integral structure with the columns 41 to support the columns 41. Numeral 6 denotes the Si wafers, each of which has an orientation flat at the position of 49 in FIG. 12. Each Si wafer is embedded in a counterbore (depression) of the wafer backing seating 45 and is held by means of the wafer cover 44.

The wafer backing seatings 45 have the diameter approximately 0.1 to 0.5 mm larger than that of the Si wafers 6, and each seating 45 is provided with a counterbore (depression) matching the shape of the orientation flat part 49 of the Si wafer 6. Each Si wafer 6 is embedded in the counterbore. Therefore, the wafer backing seatings 45 serve as holding plates for holding the Si wafers 6. The diameter of the wafer covers 44 is 1 to 5 mm smaller than the size of the Si wafers 6, as shown in FIG. 12, so as to be able to support the Si wafers 6 only in the peripheral part of each Si wafer 6. Each wafer cover 44 is provided with an aperture 47 corresponding to the shape of the orientation flat part 49. Grooves 48 are formed at joints between the columns 41 and the wafer backing seatings 45, as shown in FIG. 11. The wafer covers 44 are fitted into the grooves 48 whereby the wafer covers 44 are fixed. For mounting or dismounting a wafer cover 44, the wafer cover 44 is rotated in the grooves 48 before notches 46 shown in FIG. 12 are aligned with the columns 41. This structure for fixing the Si wafer 6 is also common to the portions for supporting the other Si wafers 6.

The vent hole 3 is routed inside the columns 41 and the wafer backing seatings 45 of this wafer cassette. The atmospheric gas is made to flow through this vent hole 3 up to the central part of the solution to cool the central part of the solution positively. For this reason, the wafers are cooled at an equal temperature reduction rate in the central part and in the edge part during the liquid phase growth, so as to implement the growth in uniform thickness. The upper end of the vent hole 3 reaches the top of the column-supporting disk 50 and serves as an exit/entrance for the atmospheric gas. In Embodiment 4, a gas introducing tube may be placed near this exit/entrance to positively supply the atmospheric gas into the vent hole 3.

Figure 13:
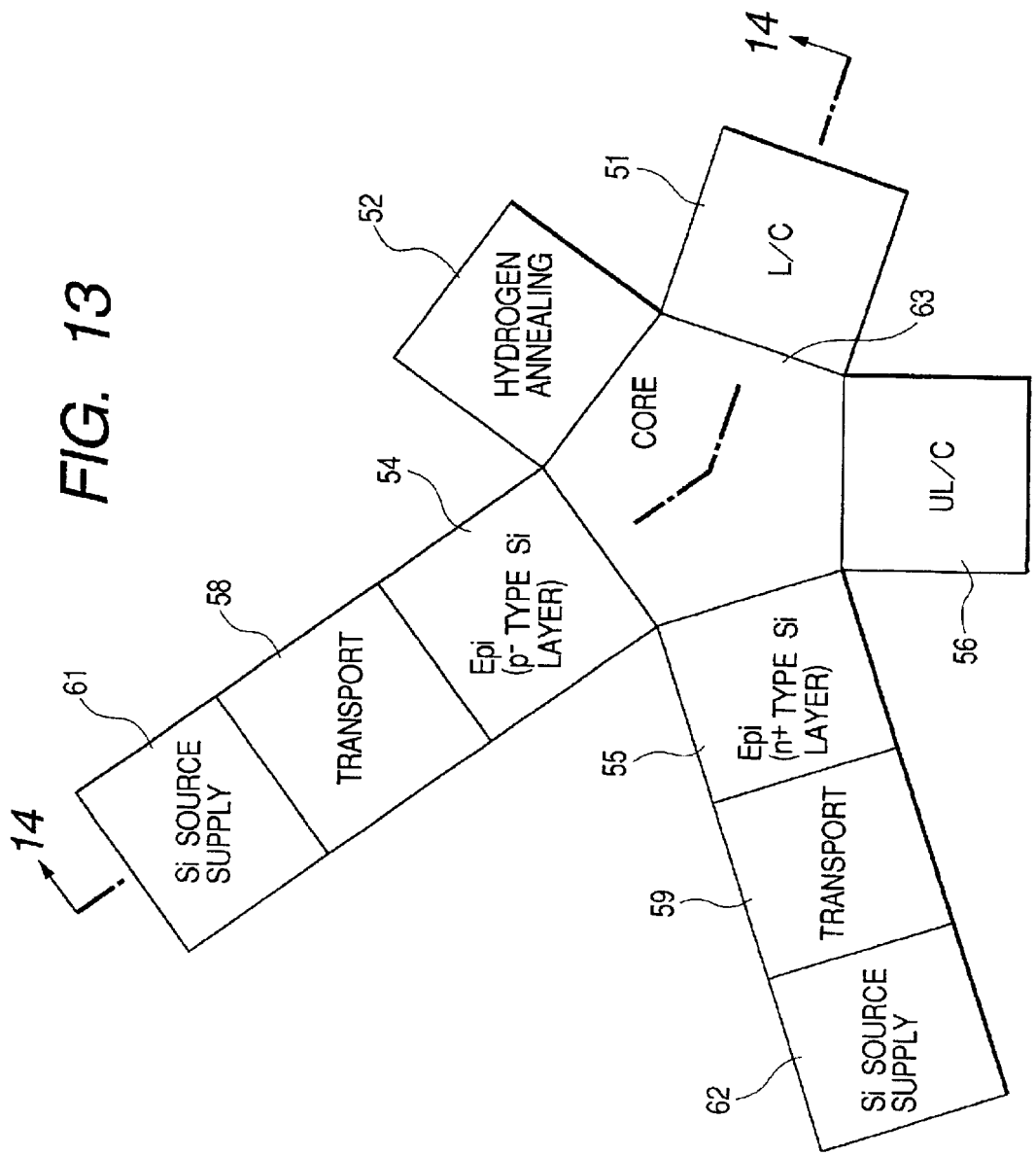
FIG. 13 is a plan view of a liquid phase growth system in Embodiment 4.

In Embodiment 4, a liquid phase growth apparatus of a dual bath type may also be used. FIG. 13 is a plan view from the top of the liquid phase growth apparatus of the dual bath type. In the figure, numeral 51 designates a loading chamber (L/C), 52 a hydrogen annealing chamber, 54 a growth chamber of p⁻ type Si layer 25, 55 a growth chamber of n⁺ type Si layer 24, 56 an unloading chamber (UL/C), and 63 a core in which a conveying system of wafer cassette 68 is located. Numerals 58 and 59 represent transport chambers for supplying the Si source to the respective growth chambers of the p⁻ type Si layer and the n⁺ type Si layer, and numerals 61 and 62 Si source stockers for supply of the Si source to the respective growth chambers of the p⁻ type Si layer and the n⁺ type Si layer.

For the liquid phase growth, the wafer cassette 68 provided with the vent hole 3 and loaded with Si wafers 6 is carried into the loading chamber (L/C) 51. Then, the wafer cassette 68 in the loading chamber (L/C) 51 is moved into the hydrogen annealing chamber 52 by the conveying system placed in the core 63, and the hydrogen annealing is carried out therein. Thereafter, the wafer cassette 68 is transferred successively to the growth chamber 54 of $p^-$ type Si layer 25 and to the growth chamber 55 of $n^+$ type Si layer 24 to form the $p^-$ type Si layer and the $n^+$ type Si layer in order on the Si wafers 6.

Figure 14:
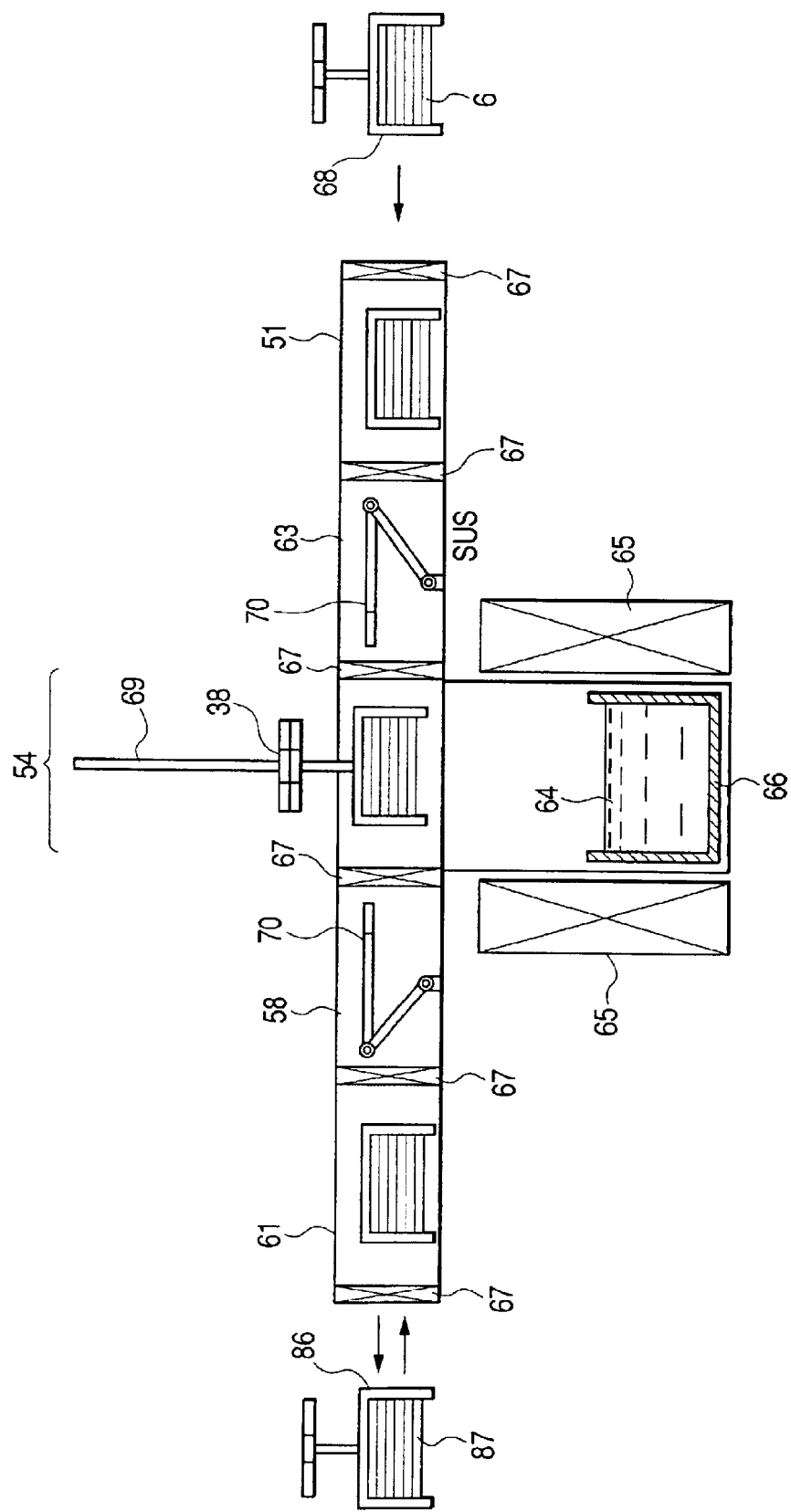
FIG. 14 is a longitudinal cross-sectional view of the liquid phase growth system of Embodiment 4 taken along line 14—14 of FIG. 13.

FIG. 14 is a cross-sectional view of FIG. 13 taken along a cutting surface 14—14. In the figure, numeral 64 designates a solution, 65 a heater, 66 a crucible, 68 the wafer cassette of the present embodiment, 69 a vertical conveying system, 70 horizontal conveying systems, 86 a dissolving wafer cassette, 87 dissolving wafers, and 38 a coupling. The components denoted by the reference symbols described previously are the same as the aforementioned components and thus the description thereof is omitted herein.

The loading chamber 51 is usually isolated from the core 63 and the external atmosphere by gate valves 67. When the right gate valve 67 of the loading chamber 51 is opened, the wafer cassette 68 can be moved into the loading chamber 51. When the left gate valve of the loading chamber 51 is opened, the wafer cassette 68 can be moved into the growth chamber 54 of $p^-$ type Si layer by means of the horizontal conveying system 70 in the core 63.

The Si source supply chamber 61 is constructed so that the dissolving wafer cassette 86 can be moved into or out of the chamber by opening the left gate valve 67. When the right gate valve is opened, the dissolving wafer cassette 86 can be moved into the growth chamber 54 of $p^-$ type Si layer by means of the horizontal conveying system 70 in the transport chamber 58. The growth chamber 54 of $p^-$ type Si layer has the vertical conveying system 69 for vertically moving the wafer cassette 68 and the dissolving wafer cassette 86. The vertical conveying system 69 can immerse the wafer cassette 68 and the dissolving substrate cassette 86 into the solvent 64 (also called a melt) stored in the crucible 66. At the coupling 38 the quartz wafer cassette 68 is coupled to the vertical conveying system 69 of stainless steel. This coupling method is desirably a locking system. The heater 65 heats the melt to a high temperature to keep the melt in a liquid state. The growth chamber 55 of $n^+$ type Si layer, the transport chamber 59, and the Si source supply chamber 62 are also of the same sectional structure as in FIG. 14. With the wafer cassette 68, the back and side surfaces of the Si wafers 6 are kept from touching the solution 64 so that a thin film is grown over only the exposed front surfaces and so that no thin film is grown on the back and the side surfaces of Si wafers 6. On the other hand, the dissolving wafer cassette 86 has the structure in which the front surface, back surface, and side surface all touch the solvent so as to dissolve as large an amount of Si from each wafer as possible. For growth of a thin film, it is desirable to rotate the wafer cassette 68 by the vertical conveying system 69.

Figure 15:
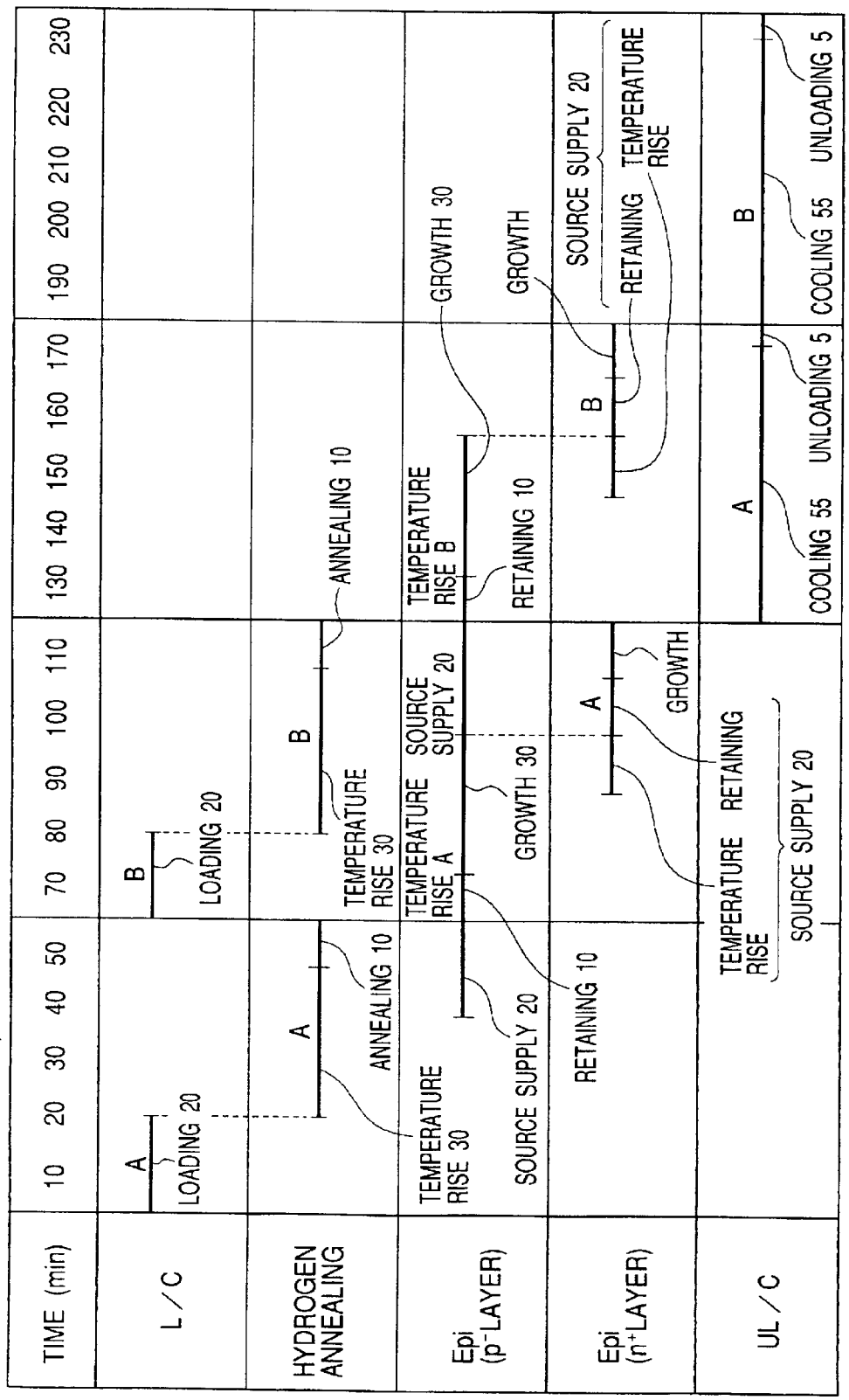
FIG. 15 is a time chart showing a sequence of liquid phase growth in Embodiment 4.
Figure 16:
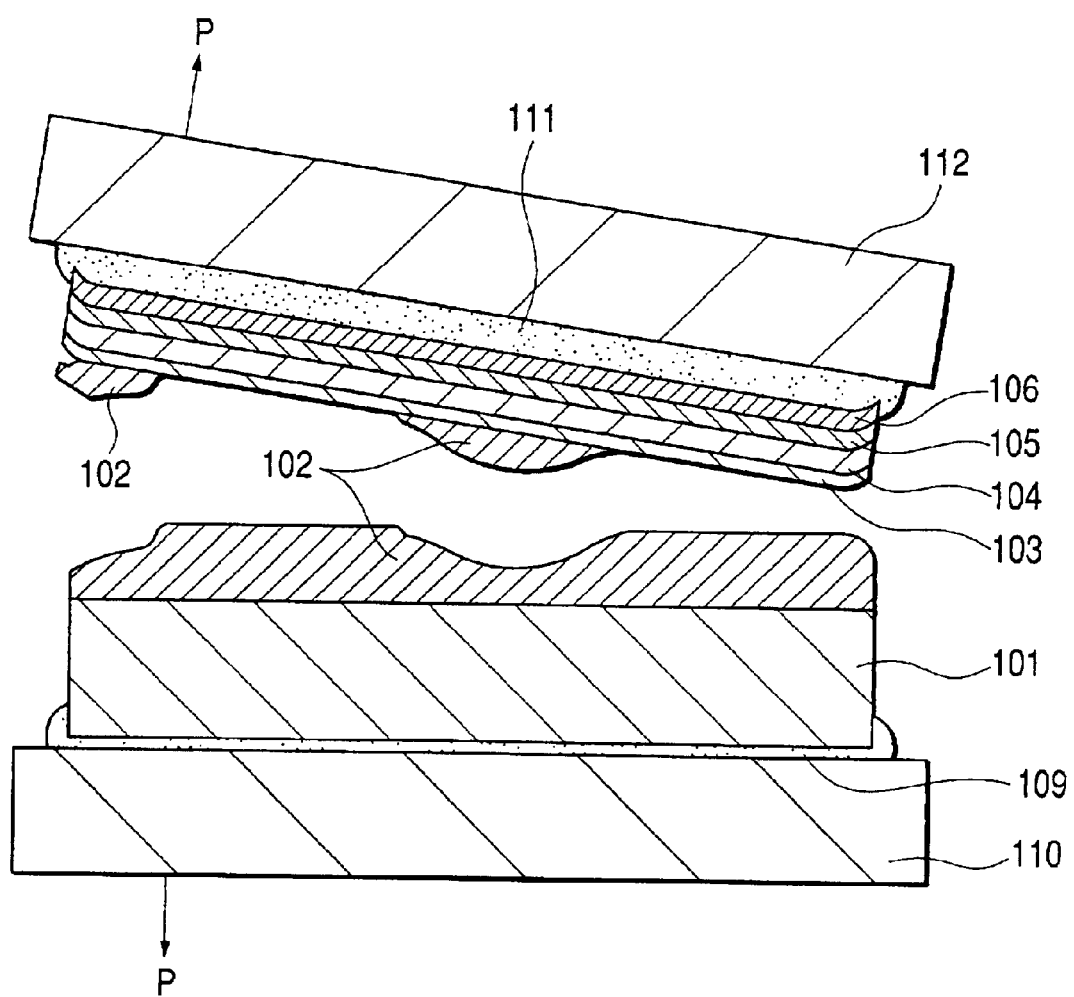
FIG. 16 is a longitudinal cross-sectional view showing a typical solar cell production step.
Figure 17:
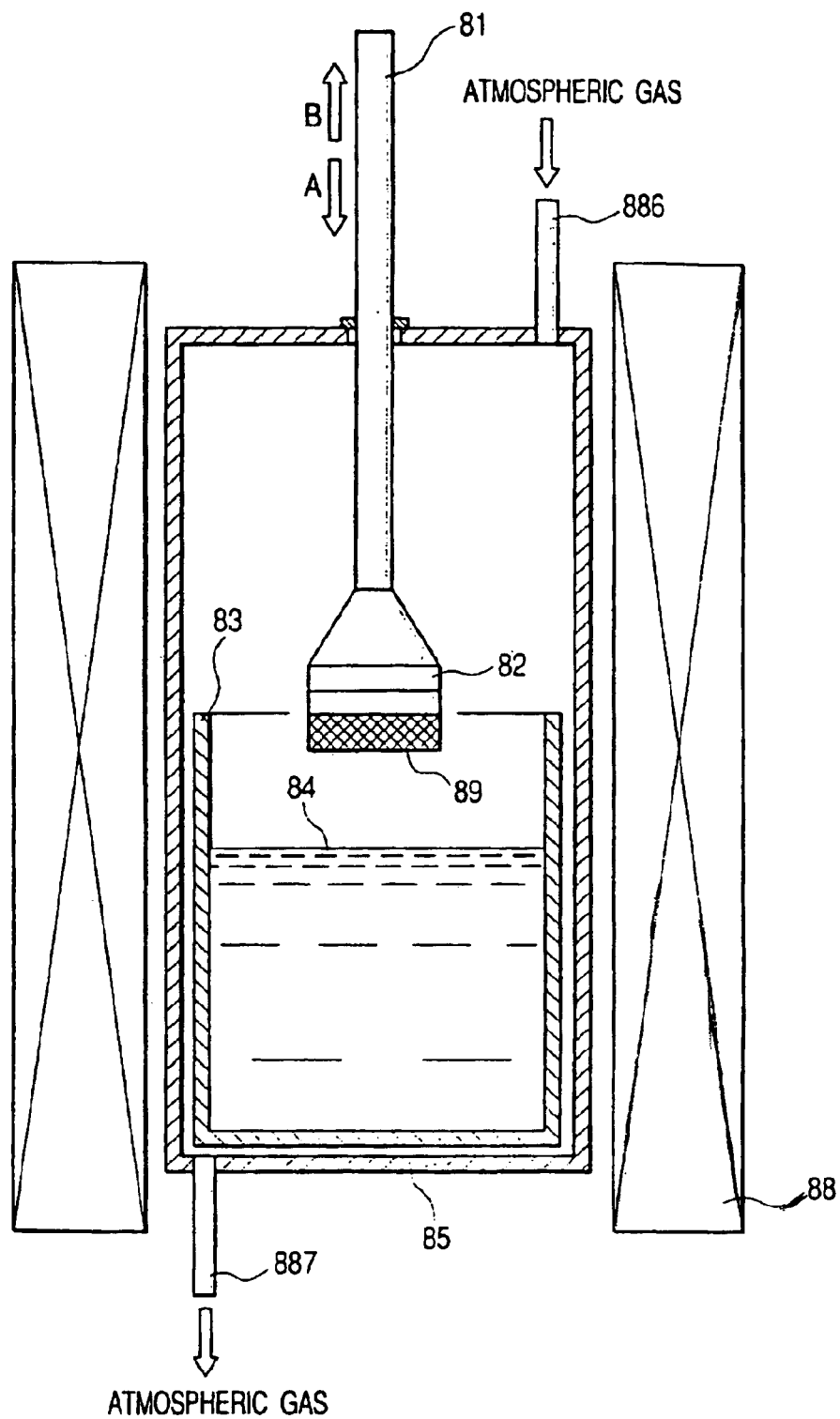
FIG. 17 is a longitudinal cross-sectional view of a typical liquid phase growth apparatus.
Figure 18A:
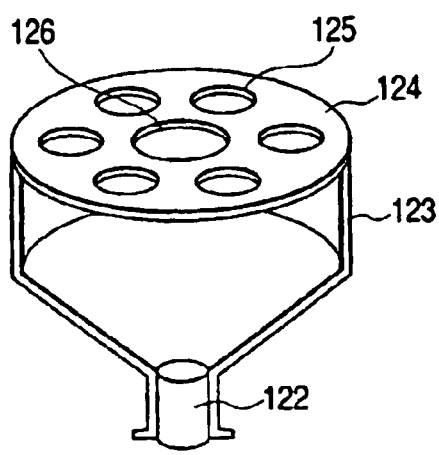
FIGS. 18A, 18B, and 18C are schematic views showing a typical liquid phase growth apparatus.
Figure 18B:
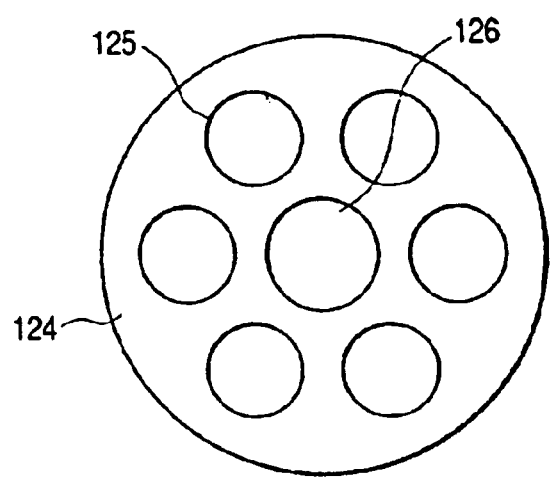
Figure 18C:
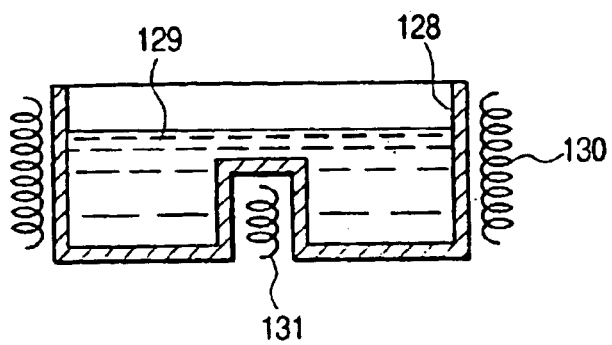
Figure 19:
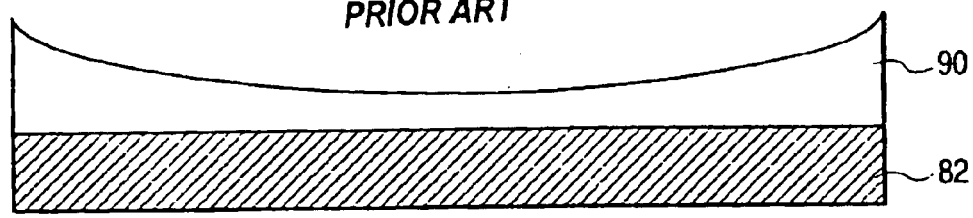
FIG. 19 is a cross-sectional view of a deposited layer by a typical liquid phase growth method.

FIG. 15 is a time chart showing the sequence of operating the liquid phase growth apparatus of FIGS. 13 and 14. Symbol A represents motion of the wafer cassette of the first batch. The wafer cassette of the first batch is loaded into the loading chamber (L/C) 51 in first twenty minutes and then carried into the hydrogen annealing chamber 52. In the hydrogen annealing chamber 52, the temperature of the wafer cassette 68 is raised for thirty minutes and hydrogen annealing is implemented for ten minutes. The hydrogen annealing is carried out at about 1040° C. in the hydrogen atmosphere. Immediately after the hydrogen annealing, a small amount of $SiH_4$ (silane) may be allowed to flow, so as to improve the surface property of the porous Si layer 27. Then, the wafer cassette 68 is moved into the $p^-$ type Si layer growth chamber 54 by means of the horizontal conveying system 70 of the core 63 and the wafer cassette 68 is retained for ten minutes before it is raised to the temperature of growth. During this period, the solution 64a is cooled to bring the $p^-$ type Si into the supersaturated state in the solution 64a. Before the wafer cassette 68 is moved into the $p^-$ type Si growth chamber 54, the dissolving wafer cassette 86 holding $p^-$ type Si wafers is transferred from the Si source supply chamber 61 through the transport chamber 58 into the growth chamber 54 and is immersed into the high-temperature solvent to solve $p^-$ type Si into the solvent. The material of the solvent is, for example, In, Sn, or the like. The solution containing $p^-$ type Si is prepared in this way.

Then, the wafer cassette 68 is immersed into the solution 64a by means of the vertical conveying system and the temperature of the solution 64a is slowly reduced, whereupon the $p^-$ type Si layer 25 is epitaxially grown on the surface of the porous Si layer 27. The period of time for this growth is about 30 minutes. After that, the wafer cassette 68 is lifted up from the solution 64a to the $p^-$ type Si growth chamber 54 and retained for ten minutes.

Likewise, the dissolving wafer cassette holding $n^+$ type Si wafers is preliminarily immersed in the solvent to dissolve $n^+$ type Si into the solvent for twenty minutes. The solution containing $n^+$ type Si is prepared in this way. Then, the wafer cassette 68 is immersed into the solution 64b and the temperature of the solution 64b is slowly reduced, whereupon the $n^+$ type Si layer is epitaxially grown on the surface of the $p^-$ type Si layer. The period of time for this growth is about ten minutes.

After that, the wafer cassette 68 is lifted up from the solution 64b and moved into the unloading chamber 56. The wafer cassette 68 is cooled to room temperature in the unloading chamber 56 for fifty five minutes. After that, the wafer cassette 68 is taken out of the liquid phase growth apparatus in last five minutes.

Symbol B represents motion of the wafer cassette of the second batch. The wafer cassette of the second batch is also moved according to the time chart of FIG. 15 and the motion thereof is similar to the motion of the wafer cassette of the first batch. Therefore, the description of the second batch is omitted herein. The liquid phase growth apparatus of Embodiment 4 allows the liquid phase growth of a new wafer cassette every 60 minutes.

In the liquid phase growth apparatus and liquid phase growth methods, the cooling may be implemented by liquid like water or liquid metal.

According to the liquid phase growth methods of the present invention, the solution is cooled from the interior thereof so as to suppress the temperature difference between the interior and periphery of the solution, which permits the growth in uniform thickness. The growth material is dissolved into the solvent to prepare the solution and the substrate is immersed into the solution stored in the crucible whereby the deposited film can be grown on the substrate by the liquid phase growth from the solution. When the central part of the solution is cooled in the cooling section, the temperature difference is canceled between the central part and peripheral part of the solvent, whereby the growth in uniform thickness can be implemented both in the central part and in the peripheral part. The present invention also provides the apparatus used in the foregoing methods.

What is claimed is:

1. A liquid phase growth method comprising the steps of:

immersing a substrate in a crucible that stores a solvent having a growth material dissolved therein; and flowing a medium through a medium flow path provided in the solvent, without blowing the medium up through the solvent, to cool the solvent from an interior thereof.

2. The liquid phase growth method according to claim 1, wherein the solvent is cooled from a central part thereof.

3. The liquid phase growth method according to claim 1, wherein the medium flow path comprises a tube through which the medium flows immersed in the crucible.

4. The liquid phase growth method according to claim 3, wherein the medium is a gas.

5. The liquid phase growth method according to claim 1, wherein the medium flow path comprises a tube through which the medium flows formed in a jig for holding the substrate.

6. The liquid phase growth method according to claim 1, wherein the medium flow path comprises a hole through which the medium flows formed in the crucible.

7. The liquid phase growth method according to claim 1, wherein a liquid phase growth bath for formation of a $p^-$ type Si layer is used as the crucible and, subsequent thereto, a liquid phase growth bath for formation of an $n^+$ type Si layer is used as the crucible.

8. The liquid phase growth method according to claim 1, wherein the growth material is Si, Ge, or GaAs.

9. The liquid phase growth method according to claim 1, wherein the solvent is a melt of In or Sn.

* * * * *

UNITED STATES PATENT AND TRADEMARK OFFICE
CERTIFICATE OF CORRECTION

PATENT NO. : 6,802,900 B2
DATED : October 12, 2004
INVENTOR(S) : Masaaki Iwane et al.

It is certified that error appears in the above-identified patent and that said Letters Patent is hereby corrected as shown below:

<u>Title page,</u>
Item [56], References Cited, OTHER PUBLICATIONS, "US Pat. application # (Spec.) 09/973,633." should read -- US Pat. application # (Spec.) 09/978,633. --.

Signed and Sealed this

Fifth Day of July, 2005

JON W. DUDAS
*Director of the United States Patent and Trademark Office*